(12) United States Patent
Hayashida et al.

(10) Patent No.: US 8,377,501 B2
(45) Date of Patent: Feb. 19, 2013

(54) COATING AND DEVELOPING SYSTEM CONTROL METHOD OF CONTROLLING COATING AND DEVELOPING SYSTEM

(75) Inventors: Yasushi Hayashida, Koshi (JP); Yoshitaka Hara, Koshi (JP); Tomohiro Kaneko, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 702 days.

(21) Appl. No.: 12/438,031

(22) PCT Filed: Sep. 11, 2007

(86) PCT No.: PCT/JP2007/067670
§ 371 (c)(1),
(2), (4) Date: Feb. 19, 2009

(87) PCT Pub. No.: WO2008/032714
PCT Pub. Date: Mar. 20, 2008

(65) Prior Publication Data
US 2010/0021621 A1    Jan. 28, 2010

(30) Foreign Application Priority Data
Sep. 12, 2006 (JP) .................. 2006-247084

(51) Int. Cl.
*C23C 16/52* (2006.01)
*C23C 14/54* (2006.01)
(52) U.S. Cl. ............................ 427/8; 427/10
(58) Field of Classification Search ................ 427/8, 10
See application file for complete search history.

(56) References Cited

U.S. PATENT DOCUMENTS

| 6,593,045 B2 | 7/2003 | Sato et al. |
| 6,722,798 B2 | 4/2004 | Senba et al. |
| 2005/0061242 A1* | 3/2005 | Shiga et al. .................. 118/708 |
| 2007/0088450 A1 | 4/2007 | Shinozuka et al. |

FOREIGN PATENT DOCUMENTS

| JP | 2002-026107 A1 | 1/2002 |
| JP | 2003-209154 A1 | 7/2003 |
| JP | 2005-093920 A1 | 4/2005 |
| JP | 2005-101048 A1 | 4/2005 |
| JP | 2005-175052 A1 | 6/2005 |
| JP | 2006-019622 A1 | 1/2006 |
| TW | I248657 B | 2/2006 |

* cited by examiner

*Primary Examiner* — Brian K Talbot
(74) *Attorney, Agent, or Firm* — Burr & Brown

(57) ABSTRACT

A coating and developing system and control method is provided. The system and control method curtails the amount of time for which a substrate is held with no purpose while improving the throughput of the coating and developing system. An inspection station through which a substrate processed in a processing station is transferred to a carrier station includes a plurality of different inspection modules respectively taking different inspection times, a buffer unit for temporarily holding a substrate and a substrate carrying means controlled by a controller. When the inspection module is engaged in inspecting a substrate, the substrate carrying means carries another substrate to be inspected by the same inspection module to the buffer unit and the substrate is held in the buffer unit. Thus, the holding of wafers in the inspection modules can be suppressed and the throughput can be improved.

8 Claims, 19 Drawing Sheets

|  | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| INSPECTION MODULE E1 | ● |   |   | ● | ● |   | ● | ● |   |   | ● | ● |   | ● | ● |   |   | ● | ● |   |   | ● |   |   |   |
| INSPECTION MODULE E2 |   | ● |   |   |   | ● |   |   | ● | ● |   |   | ● |   |   |   | ● |   |   |   |   |   |   |   |   |
| INSPECTION MODULE E3 |   |   | ● | ● |   |   |   | ● | ● | ● |   |   |   |   |   |   |   |   |   |   |   |   |   |   |   |

CYCLE TIME : 24s INSPECTION TIME TAKEN BY THE INSPECTION MODULE E1:36s
INSPECTION TIME TAKEN BY THE INSPECTION MODULE E2:90s
INSPECTION TIME TAKEN BY THE INSPECTION MODULE E3:118s

FIG. 6

COATING AND DEVELOPING SYSTEM CONTROL METHOD OF CONTROLLING COATING AND DEVELOPING SYSTEM

FIELD OF THE INVENTION

The present invention relates to a coating and developing system for processing a substrate, such as a semiconductor wafer or a LCD substrate, namely, a glass substrate for a liquid crystal display, by a coating process for coating the substrate with a resist solution and for processing the substrate processed by an exposure process by a developing process, a control method of controlling the coating and developing system, and a storage medium.

BACKGROUND OF THE INVENTION

A series of processes for forming a desired resist pattern by coating a substrate for forming a semiconductor devices or a LCD substrate with a resist solution, exposing a resist film to light through a photomask and developing the exposed resist film is carried out by a system built by connecting an exposure system to a coating and developing system for resist solution application and development.

The coating and developing system is formed by arranging in a line a carrier station provided with a transfer arm for receiving a semiconductor wafer (hereinafter, referred to simply as "wafer") from and delivering a wafer to a wafer carrier placed in the carrier station, a processing station for processing a wafer by a coating process and a developing process, and an interface station.

A substrate provided with a resist pattern is inspected by a predetermined inspection procedure for matters including the line width of the resist pattern, registration of the resist patter with a base pattern and development defects. Only the acceptable substrates passed the inspection are sent to the next process. In most cases, the inspection procedure is carried out by a stand-alone inspection apparatus separate from the coating and developing system. It is more convenient to carry out the inspection procedure by an inline inspection system incorporated into the coating and developing system.

An arrangement mentioned in Patent document 1 includes an inspection station provided with a plurality of inspection devices and a carrying arm and interposed between a carrier station and a processing station. A system mentioned in Patent document 1 carries a substrate from the carrier station through the inspection station to the processing station, returns a completely processed substrate to a carrier placed in the carrier station, and then, the substrate is carried from the carrier to the inspection station for inspection.

FIG. 19 shows the actual arrangement of this system. FIG. 19 is a schematic plan view of a coating and developing system. Shown in FIG. 19 are a carrier station 11, an inspection station 12, a processing station 13, an interface station 14 connected to an exposure system, carriers 20, a transfer arm 15 installed in the carrier station 11, and a carrying arm 16 installed in the inspection station. Indicated by TRSa, TRSb, TRSc and TRSd are transfer modules, and indicated by E1, E2 and E3 are inspection modules. Those modules are arranged in a plane for convenience in FIG. 19. Actually, the transfer modules are stacked, for example, in four layers and the inspection modules are stacked, for example, in three layers.

In the coating and developing system in the first embodiment, a wafer contained in the carrier 20 is carried from the carrier 20 via the transfer arm 15, the TRSa, and the carrying arm 16 to the processing station 13. The wafer is processed by necessary processes by the modules of the processing station 13 and is transferred through the interface station 14 to an exposure system. Then, the wafer is returned from the exposure system to the processing station 13 and the wafer is processed by processes necessary for developing by the modules of the processing station 13. The wafer thus processed is returned from the processing station 13 via the carrying arm 16, the TRSb and the transfer arm 15 to the carrier 20.

Wafers contained in the carrier 20 are processed in due order. For example, when twenty-five wafers are contained in the carrier 20, numbers 1 to 25 are assigned to those wafers. First, the wafer No. 1 is carried to the processing station 13 and is carried to the predetermined modules in sequence. The carrying arm, namely, the main arm, of the processing station 13 carries the wafer by a cyclic carrying operation to a predetermined series of modules in sequence. The main arm uses two arms for changing a wafer in the module. Suppose that a carrying path along which the main arm carries a wafer is called a circulation path. Then, the carrying arm moves once along the circulation path in a predetermined cycle time. The carrying arm does not make operations to move back and to carry a wafer of a larger number, namely a wafer taken out of the carrier 20 later skipping a wafer of a smaller number, namely, a wafer taken out of the carrier 20 earlier. Those operations are inhibited because those operations are actually infeasible and complicate a carrying program. In recent years, the coating and developing system is required to process 150 wafers per hour. Therefore, the cycle time for the cyclic carrying operation is, for example, 24 s=3600 s/150.

All of the wafers returned to the carrier 20 or some chosen ones of the wafers returned to the carrier 20 are transferred to the transfer module TRSc by the transfer arm 15. The carrying arm 16 carries the wafers to the inspection modules. For example, some of the wafers are inspected only by the inspection module E1, some of the wafers are inspected only by the inspection module E2, some of the wafers are inspected only by the inspection module E3 and some of the wafers are inspected by the inspection module E2 and the inspection module E3 in sequence. Wafers are carried in the inspection station 12 by a cyclic carrying operation similar to that by which wafers are carried in the processing station in synchronism with the latter cyclic carrying operation.

When wafers are carried by the foregoing cyclic carrying operation, the transfer arm 15 needs to execute many carrying steps. The transfer arm 15 cannot carry a wafer to the carrier 20 while the same is in operation to carry a wafer to the inspection station 12 and the transfer arm 15 cannot carry a wafer to the inspection station 12 while the same in operation to carry a wafer to the carrier 20. Therefore, a state in which a wafer is obliged to be held in the module of each station for a time corresponding to one cycle or longer, which reduces the throughput.

The inspection modules E1 to E3 execute different inspections, respectively, and different inspections take different inspection times, respectively. Suppose that a wafer is to be inspected by the inspection modules E1 and E2 in that order. When the inspection of the wafer by the inspection module E1 is completed, the inspection module E2 is engaged in inspecting another wafer. Therefore, the wafer cannot be carried from the inspection module E1 to the inspection module E2 and is obliged to be held in the inspection module E1 until the inspection of another wafer by the inspection module E2 is completed. A succeeding wafer cannot be carried to the inspection module E1 during a cycle in which the wafer is held in the inspection module E1 and, consequently, it is possible that the throughput decreases.

A coating and developing system mentioned in Patent document 2 has a carrier station, a processing station and an inspection station interposed between the carrier and the processing station, and carries a wafer to the processing station, the inspection station and the carrier station in that order. However, this coating and developing system cannot solve the foregoing problems and it is possible that wafers are obliged to be held in inspection modules because of different inspection times taken by inspection modules.

Patent document 1: JP 2005-175052 A (Par. 0042, FIG. 4)
Patent document 2: JP 2002-26107 A (Par. 0045)

SUMMARY OF THE INVENTION

Problem to be Solved by the Invention

The present invention has been made in view of such circumstances and it is therefore an object of the present invention to provide techniques for curtailing time for which a substrate is held to no purpose in an inspection module to improve the throughput of a coating and developing system.

Means for Solving the Problem

A coating and developing system of the present invention includes: a carrier station holding carriers each containing a plurality of substrates, and provided with a first substrate carrying means for taking out a substrate from and putting a substrate into the carrier; a processing station including a plurality of processing modules for applying a resist to a substrate received from the first carrying means and for processing a substrate coated with the resist and processed by an exposure process by a developing process or processing the substrate by processes before and after the developing process, and provided with a second substrate carrying means for carrying a substrate to those processing modules in sequence; a first transfer unit for holding a substrate processed by the developing process in the processing station; a second transfer unit from which a substrate is received by the first carrying means of the carrier station; an inspection station, through which a substrate processed in the processing station is transferred to the carrier station, including a plurality of inspection modules that take different inspection times, respectively, a buffer unit for temporarily holding a substrate, and a third substrate carrying means for carrying a substrate to and from the buffer unit, the first transfer unit, the second transfer unit and the inspection modules; and a controller for controlling the third substrate carrying means; wherein the controller is capable of carrying out, when a substrate in the first transfer unit is carried, the steps of: (a1) deciding whether or not the substrate is an inspection subject, (a2) carrying the substrate to the second transfer unit when the substrate is not an inspection subject, and (a3) deciding whether or not an inspection module for inspecting the substrate is available when the substrate is an inspection subject, and carrying the substrate to the inspection module when the inspection module is available or carrying the substrate to the buffer unit when the inspection module is unavailable, and capable of carrying out, when the substrate in the module of the inspection station is carried, the steps of: (b1) deciding whether or not all the inspections assigned to the substrate have been completed, (b2) carrying the substrate to the second transfer unit when all the inspections assigned to the substrate have been completed, and (b3) deciding whether or not the inspection module for carrying out an inspection not yet executed is available and carrying the substrate to that inspection module when the inspection module is available or placing the substrate in the buffer unit when that inspection module is unavailable.

In the coating and developing system, the controller may carry out the step of deciding whether or not the buffer unit is available and carrying the substrate to the buffer unit when the buffer unit is available or carrying the uninspected substrate to the second transfer unit when the buffer unit is unavailable instead of carrying the substrate to the buffer unit when it is decided in the step (a3) that the inspection module is unavailable. In such a case, for example, an alarm generating means generates an alarm when it is decided in step (a3) that the buffer unit is unavailable, an uninspected substrate as an inspection subject carried to the second transfer unit may be carried to the carrier station. In such a case, for example, the substrate as an inspection subject is carried into the carrier.

For example, the controller executes the step of carrying the uninspected substrate which is an inspection subject carried to the carrier station to the inspection station, and the controller is provided with a selecting means for selecting executing the step of carrying the uninspected substrate which is an inspection subject to the inspection station or not executing the same step. The coating and developing system may further include a third transfer unit to which a substrate taken out of the carrier is transferred by the first substrate carrying means, and a shuttle carrying means for carrying the substrate across the inspection station to the processing station. In such a case, the buffer unit, the second transfer unit and the third transfer unit may be vertically stacked. For example, the buffer unit, the second transfer unit, the third transfer unit and at least one of the inspection modules are stacked vertically.

A coating and developing system control method including: a carrier station holding carriers each containing a plurality of substrates, and provided with a first substrate carrying means for taking out a substrate from and putting a substrate into the carrier; a processing station including a plurality of processing modules for applying a resist to a substrate received from the first carrying means and for processing a substrate coated with the resist and processed by an exposure process by a developing process or processing the substrate by processes before and after the developing process, and provided with a second substrate carrying means for carrying a substrate to those processing modules in sequence; a first transfer unit for holding a substrate processed by the developing process in the processing station; a second transfer unit from which a substrate is received by the first carrying means of the carrier station; and an inspection station, through which a substrate processed in the processing station is transferred to the carrier station, including a plurality of inspection modules that take different inspection times, respectively, a buffer unit for temporarily holding a substrate, and a third substrate carrying means for carrying a substrate to and from the buffer unit, the first transfer unit, the second transfer unit and the inspection modules includes steps to be executed when the substrate in the first transfer unit is carried including: (a1) deciding whether or not a substrate is an inspection subject, (a2) carrying the substrate to the second transfer unit when the substrate is not an inspection subject, and (a3) deciding whether or not an inspection module for inspecting the substrate is available when the substrate is an inspection subject and carrying the substrate to the available inspection module when the substrate is an inspection subject or carrying the substrate to the buffer unit when the inspection module is unavailable; and steps to be executed when a substrate in the module of the inspection station is carried including: (b1) deciding whether or not all the inspections assigned to the substrate have been completed, (b2) carrying the substrate to the second transfer unit when all the inspections assigned to the substrate have been completed, and (b3) deciding whether or not the inspection module for carrying out an inspection not yet executed is available and carrying the substrate to that inspection module when the inspection module is available or placing the substrate in the buffer unit when that inspection module is unavailable.

For example, the coating and developing system control method may execute the step of deciding whether or not the buffer unit is available and carrying the substrate to the buffer unit when it is decided that the buffer unit is available or carrying the substrate as an uninspected substrate to the second transfer unit instead of carrying out the step of carrying the substrate to the buffer unit when it is decided in step (a3) that the inspection module is unavailable. In such a case, for example, the coating and developing system control method includes the step of generating an alarm when it is decided in step (a3) that the buffer unit is unavailable.

An uninspected substrate as an inspection subject carried to the second transfer unit is carried to the carrier station, and the substrate, for example, as an inspection subject is carried into the carrier.

The coating and developing system control method may include, for example, the step of carrying the uninspected substrate as an inspection subject carried to the carrier station to the inspection station. In such a case, for example, the coating and developing system control method includes the step of selecting executing the step of carrying the uninspected substrate as an inspection subject to the inspection station or not executing the same to the inspection station. The coating and developing system control method may include the steps of transferring a substrate taken out from the carrier to a third transfer unit by the first substrate carrying means, and carrying the substrate across the inspection station from the third transfer unit to the processing station.

A storage medium of the present invention storing a computer program to be executed by a coating and developing system for applying a resist to a substrate, and for processing a substrate coated with the resist and processed by an exposure process by a developing process, wherein the computer program specifies the steps of the coating and developing system control method.

According to the present invention, the inspection station, through which a substrate processed in the processing station to the carrier station, includes the plurality of inspection modules respectively requiring different inspection times, the buffer unit for temporarily holding a substrate, and the substrate carrying means controlled by the controller, a substrate to be inspected by the inspection module is carried to the buffer unit by the substrate carrying means and held in the buffer unit when the inspection module is engaged in inspecting the preceding substrate to avoid holding the substrate in the inspection module. Wafers W can be efficiently inspected by the inspection modules. The present invention carries the substrate processed by the developing process from the processing station to the inspection station, inspects the substrate in the inspection station, and then, carries the substrate to the carrier station. Therefore, load on the carrying means is small as compared with that on the carrying means that carries the substrate processed by the developing process again from the carrier station to the inspection station. Thus, the reduction of the through put can be suppressed.

BRIEF DESCRIPTION OF THE DRAWINGS

FIG. 6 is a table of a delivery plan for carrying wafers to inspection modules specified by a controller included in the coating and developing system in the first embodiment;

DETAILED DESCRIPTION OF THE INVENTION

Figure 1:
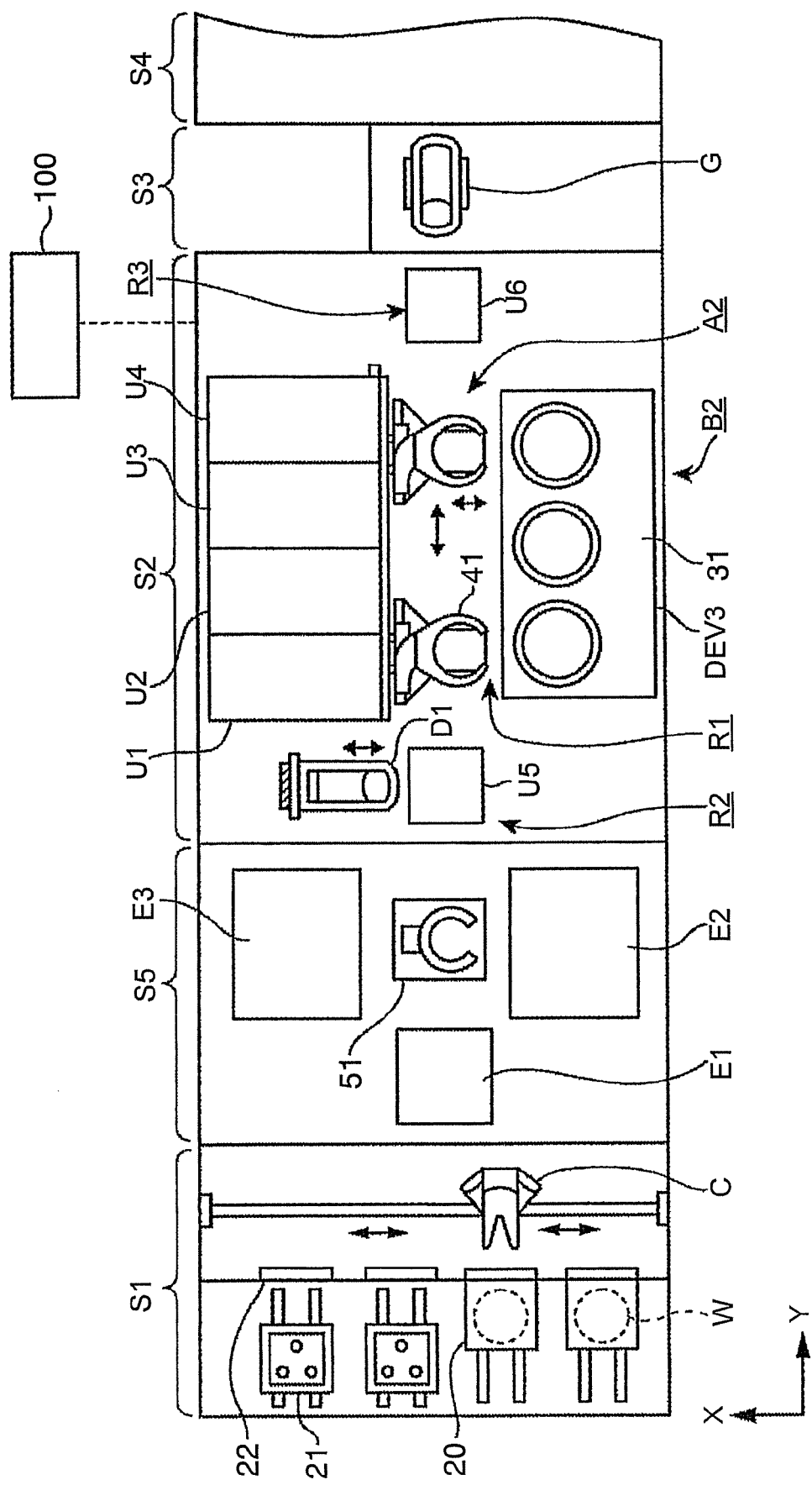
FIG. 1 is a plan view of a coating and developing system in a first embodiment according to the present invention.
Figure 2:
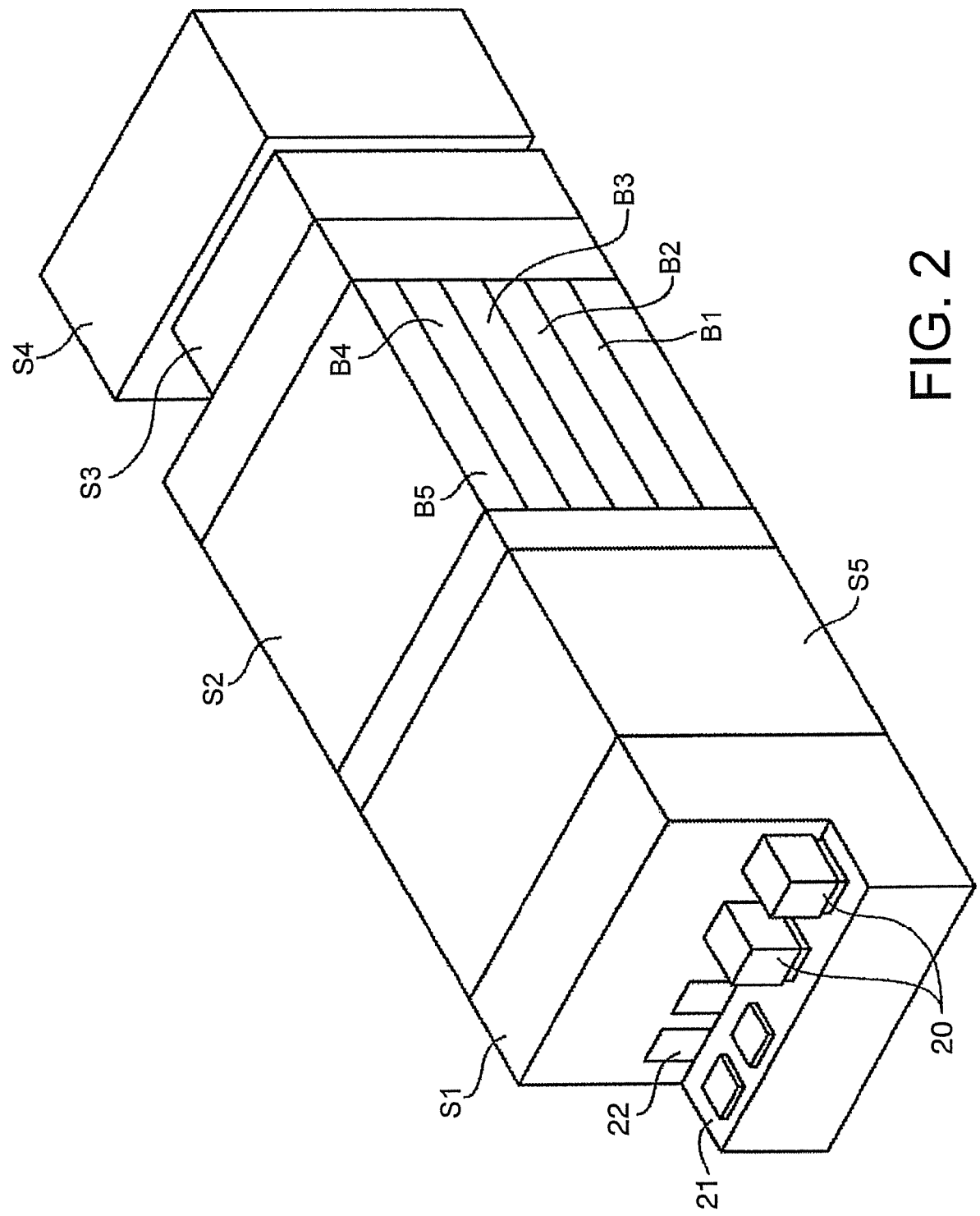
FIG. 2 is a perspective view of the coating and developing system in the first embodiment.
Figure 3:
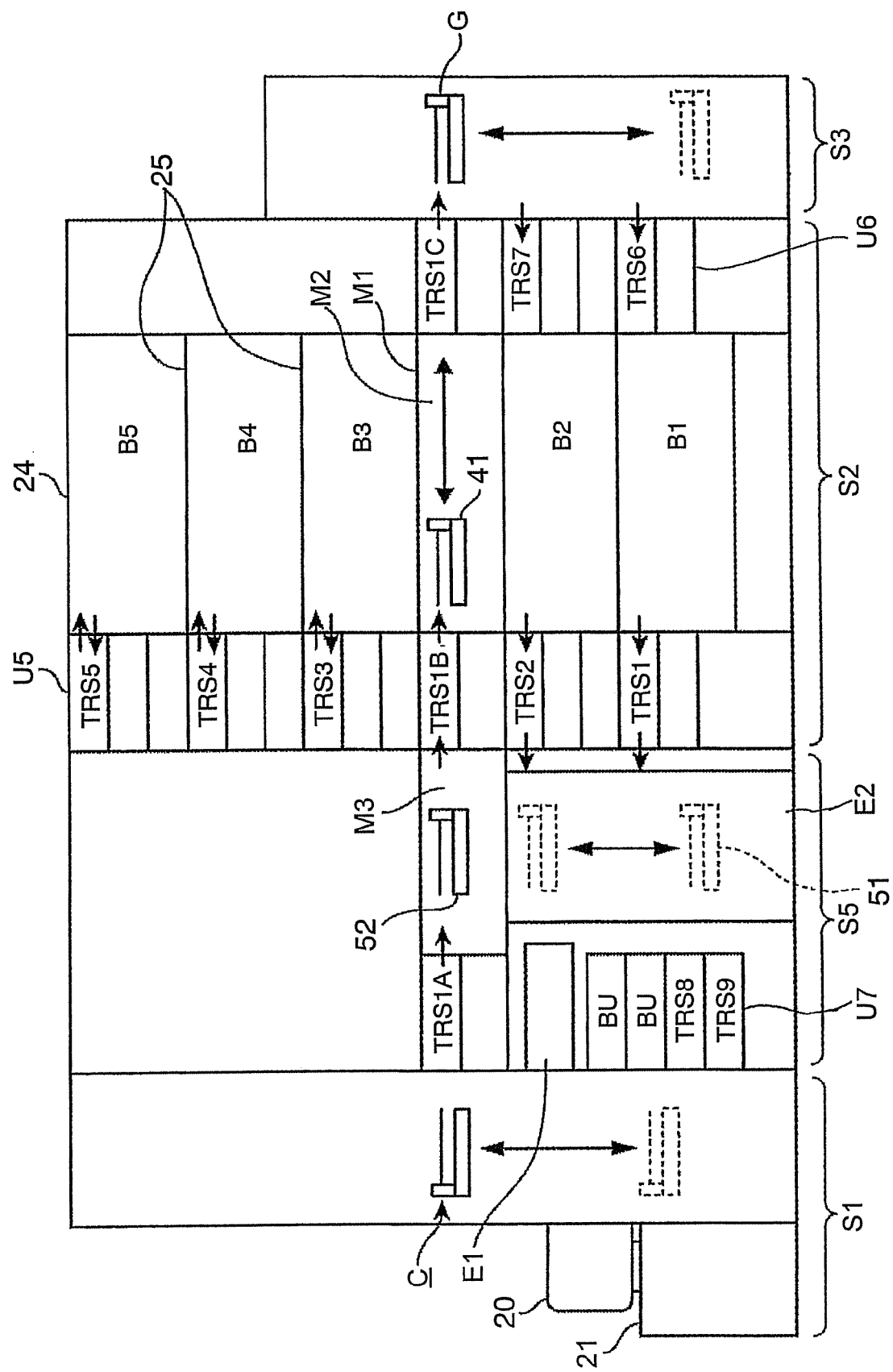
FIG. 3 is a longitudinal sectional view of the coating and developing system in the first embodiment.

A system formed by connecting a coating and developing system according to the present invention and an exposure system will be described. FIGS. 1, 2 and 3 are a plan view, a schematic perspective view and a schematic side elevation, respectively, of a coating and developing system in a first embodiment according to the present invention. The coating and developing system includes a carrier station S1 a processing station S2, and an interface station S3, an exposure system S4 and an inspection station S5 for inspecting a substrate carrying a resist pattern. The cassette station S1 receives and sends out a sealed carrier 20 containing twenty-five wafers W, namely, substrates. The processing station S2 includes, for example, five blocks B1 to B5 and a carrying block M1 longitudinally arranged in a line.

The carrier station S1 is provided with a carrier platform 21 on which a plurality of carriers 20 are supported, a wall disposed behind the carrier platform 21 and provided with closable openings 22, and a transfer arm C, namely, a first substrate carrying means, for taking out a wafer W from the carrier 20 through the closable opening 22. The transfer arm C can move in longitudinal and vertical directions, can turn about a vertical axis, and can move along a direction in which carriers 20 are arranged to carry a wafer W to and receive a wafer W from transfer stages TRS1A, TRS8 and TRS9.

The processing station S2 surrounded by a box 24 is disposed behind and joined to the inspection station S5 disposed behind the carrier station S1. The processing station S2 is built by stacking, for example, a first block (DEV layer) B1 for carrying out a developing process, a second block (DEV layer) B2 for carrying out a developing process, a carrying block M1, a third block (BCT layer) B3 for carrying out a lower antireflection film forming process for forming an antireflection film underlying a resist film (hereinafter referred to as "lower antireflection film"), a fourth block (COT layer) B4 for carrying out a coating process for applying a resist solution to a wafer, and a fifth block (TCT layer) B5 for carrying out an antireflection film forming process for forming an antireflection film overlying a resist film (hereinafter, referred to as "upper antireflection film") in that order in a vertical arrangement.

The blocks B1 to B5 and the carrying block M1 extend from the carrier station S1 toward the interface station S3. The DEV layers B1 and B2 are developing blocks, the BCT layer B3, the COT layer B4 and the TCT layer B5 are coating film forming blocks for forming a film of a photosensitive material, such as a resist. The blocks are demarcated by partition plates (base members) 25

The construction of the first block B1 to the fifth block B5 will be described. In this embodiment, the blocks B1 to B5 have common parts and are substantially the same in the layout of the component parts. Therefore, the DEV layer B2 will be described with reference to FIG. 4 by way of example. A carrying passage R1, along which a wafer W is carried, is formed in a central zone of the DEV layer B2. The carrying passage R1 extends transversely in the direction of the length of the DEV layer B2 (Y-direction in FIG. 4) to connect the carrier station S1 and the interface station S3.

A developing unit DEV3 including a plurality of developing devices 31, namely, wet-processing devices, for carrying out a developer application process is disposed along the carrying passage R1 on the right-hand side, as viewed from the side of the carrier station S1. Four shelf units U1, U2, U3 and U4 including thermal processing units for heating and cooling stacked in layers are arranged in that order in a direction from the front side toward the rear side of the DEV layer B2 on the left-hand side of the carrying passage R1. The developing unit DEV3 and the shelf units U1 to U4 are opposite to each other with respect to the carrying passage R1. Thermal processing units for carrying out a pretreatment process to be carried out before a process to be carried out by the developing unit DEV3 and a posttreatment process to be carried out after the process to be carried out by the developing unit DEV3 are stacked in two layers. The shelf units U1 to U4 are mounted on an exhaust unit 32 for exhausting the DEV layer B2.

The thermal processing units include, for example, heating units PEB for heating a wafer W processed by an exposure process, heating units for heating a wafer W processed by a developing process for drying, and cooling units CPL for adjusting the temperature of a wafer W to a predetermined temperature before and after processes to be carried out by the heating units. In this embodiment, for example, the shelf unit U1 has the two heating units PEB units stacked in two layers, each of the shelf units U2 and U3 has the two heating units other than the heating units PEB stacked in two layers, and the shelf unit U4 has the two cooling units CPL stacked in two layers.

A main arm A2, namely, a carrying means of the block, is placed in the carrying passage R1. The main arm A2 transfers a wafer W from and to the processing units of the shelf units U1 to U4, the developing units DEV3, a transfer stage TRS2 of a shelf unit U5 and a transfer stage TRS7 of the shelf unit U6. The transfer stage TRS2 and a transfer stage TRS1 constitute a first transfer unit mentioned in claims.

A zone adjacent to the inspection station S5 in the carrying passage R1 is a first wafer transfer zone R2. As shown in FIGS. 1 and 3, the shelf unit U5 is disposed in the zone R2. The main arm A2 and a carrying device 51 can access the shelf unit U5. A transfer arm D1, namely, a vertical carrying means, is disposed in the zone R2 to transfer a wafer W to and receive a wafer W from the shelf unit U5.

The shelf unit U5 has the transfer stage TRS2 for the DEV layer B2. The transfer stage TRS2 has a stage provided with a temperature adjusting mechanism for adjusting the temperature of a wafer W to a desired temperature, and lifting pins for receiving a wafer W from and transferring a wafer W to each of the foregoing arms. The lifting pins can be projected from and retracted below the surface of the stage.

In this embodiment, as shown in FIG. 3, the transfer stage TRS1 is disposed for the DEV layer B1, and transfer stages TRS3 to TRS5 are disposed respectively for the layers B3 to B5. The transfer stages TRS3 to TRS5 can transfer a wafer W to and receive a wafer W from main arms A3 to A5 installed in the layers and the transfer arm D1. Although only one TRS1 to one TRS5 are shown in FIG. 3, actually, plurality of transfer stages are placed in layers. More specifically, the carrying block M1 is provided with a transfer stage TRS1B. Each of the main arms A of the layers is a second substrate carrying means mentioned in claims.

The transfer arm D1 can moves to the DEV layer Bi to the TCT layer B5 and can move horizontally and vertically to transfer a wafer W to and to receive a wafer W from the transfer stages TRS1 to TRS5 and the transfer stage TRS1B.

A zone adjacent to the interface station S3 in the carrying passage R1 of the DEV layer B2 is a second wafer transfer zone R3. A shelf unit U6 is disposed in the second wafer transfer zone R3. As shown in FIG. 3, the shelf unit U6 is provided with transfer stages TRS6 and TRS7 respectively corresponding to the DEV layer B1 and the DEV layer B2. The main arms A1 and A2 of the layers and an interface arm G can access the transfer stages TRS6 and TRS7. A transfer stage TRS1C corresponds to the carrying block M1. The transfer stages TRS2 to TRS7, TRS1B and TRS1C and a transfer stage TRS1A are the same in construction as the transfer stage TRS1.

Figure 4:
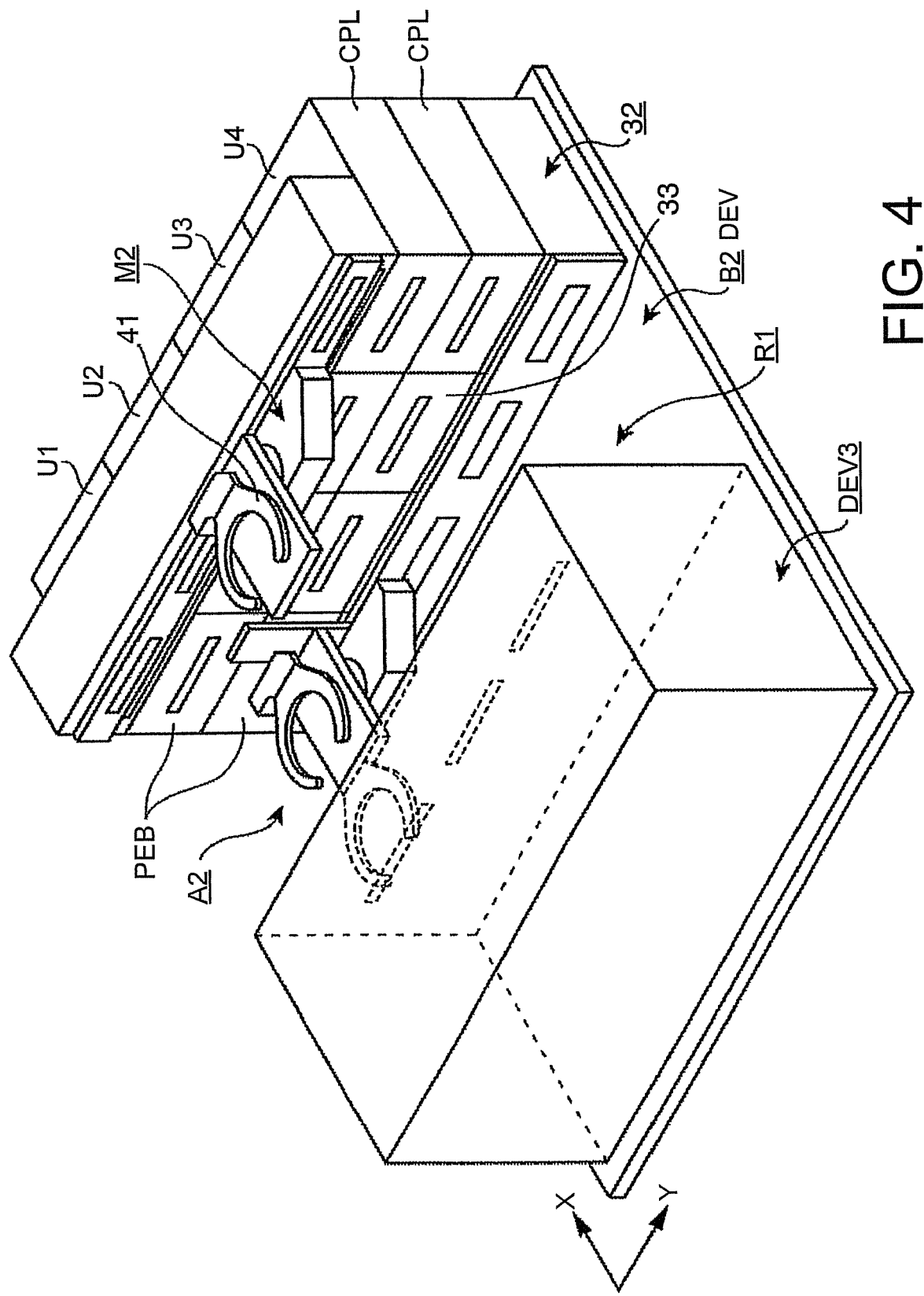
FIG. 4 is a perspective view of a processing block and a carrying block of a processing station included in the coating and developing system in the first embodiment.

The carrying block M1 will be described. The carrying block M1 is disposed between the DEV layer B2 and the BCT layer B3 to carry a wafer W directly from the carrier station Si to the interface station S3. The carrying block Ml has a carrying zone M2 separated from the respective carrying passages R1 of the DEV layer B2 and the BCT layer B3 by partition plates, and is provided with a shuttle arm 41, namely, through carrying means. The shuttle arm 41 carries a wafer W directly from the transfer stage TRS1B of the shelf unit U5 to the transfer stage TRS1C of the shelf unit U6. In FIG. 4, the partition plates are not shown.

The interface station S3 is connected to the rear end of the shelf unit U6 of the processing station S2, and the exposure system S4 is connected to the interface station S3. The interface station S3 is provided with an interface arm G for carrying a wafer W to and from the processing station S2 and the exposure system S4. The interface arm G can move in horizontal and vertical directions and can turn about a vertical axis. The transfer arm D1 is similar in construction to the interface arm G, except that the transfer arm DI does not turn about a vertical axis.

The interface arm G is a carrying means for carrying a wafer W between the processing station S2 and the exposure system S4. In this embodiment, the interface arm G receives a wafer W from the transfer stage TRS1C of the shelf unit U6 and carries the wafer W to the exposure system S4, and receives a wafer W from the exposure system S4 and carries the wafer W to the transfer stage TRS6 of the DEV layer B1 or the transfer stage TRS7 of the DEV layer B2.

The other blocks will be briefly described. The DEV layer B1 is the same in construction as the DEV layer B2. The BCT layer B3, the COT layer B4, TCT layer B5 are substantially similar in construction to the DEV layer Bi and differ from the DEV layer B1 in being provided with antireflection film forming units for applying a chemical solution for forming an antireflection film to a wafer to form an antireflection film on a wafer and coating units (COT) for applying a resist to a wafer to form a resist film on the wafer, respectively, instead of the developing unit DEV3, and in methods of applying chemical solutions to wafers. Processing conditions for the heating and cooling units included in the shelf units U1 to U4 are different. The COT layer B4 is provided with a heating unit PAB for carrying out a heating process after a resist application process instead of the heating unit PEB.

Figure 5:
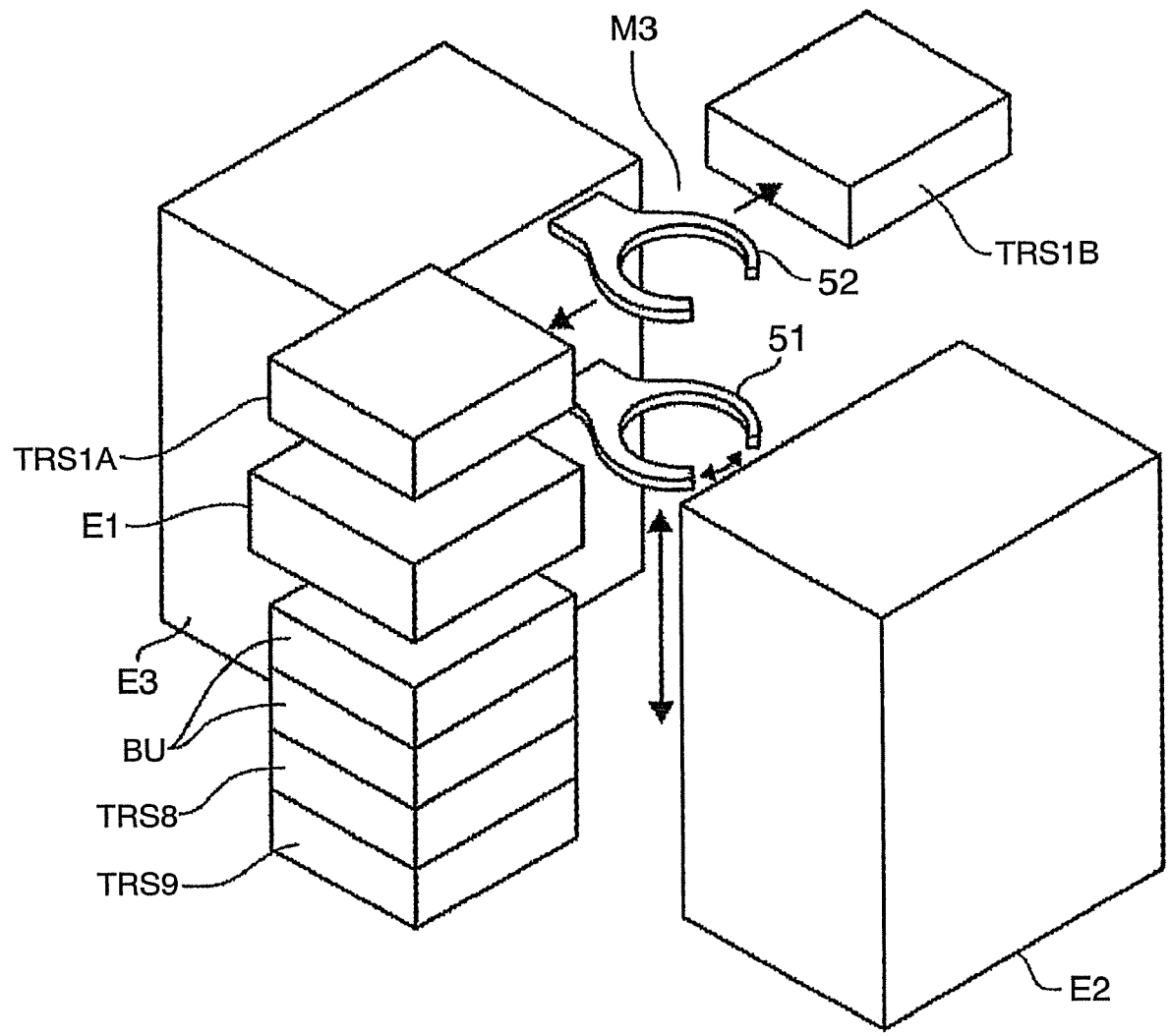
FIG. 5 is a perspective view of an inspection station included in the coating and developing system in the first embodiment.

The inspection station S5 will be described with reference also to FIG. 5. An inspection module E1 and a shelf unit U7 are disposed in a central zone of a front end part of the inspection station S5 opposite a rear end part on the side of the processing station S2. The shelf unit U7 includes, for example, transfer stages TRS9 and TRS8, and a plurality of buffer units BU capable of holding a predetermined number of wafers W stacked up in that order. The transfer stages TRS8 and TRS9 are second transfer units mentioned in claims.

As viewed in a direction from the front end toward the rear end of the inspection station S5, inspection modules E2 and E3 are disposed on the right-hand side and the left-hand side, respectively. A carrying device 51 provided with, for example, one holding arm for holding a wafer W is disposed in a central zone of the inspection station S5. The carrying device 51 can carry a wafer to and from the transfer stage TRS1 of the DEV layer B1, the transfer stage TRS2 of the DEV layer B2, the transfer stages TRS8 and TRS9 of the shelf unit U7 and the inspection modules E1 to E3.

In this embodiment, the inspection module E1 is a macro-defect detecting module for detecting large defects on the wafer W1, the inspection module E2 is a thickness and line width measuring modules for measuring the thickness of a film formed on a wafer W and the width of lines of a pattern formed on a wafer W, and the inspection module E3 is a register inspecting module for inspecting register in the exposure process, namely, the correct superimposition of a previously formed lower pattern and an upper pattern overlying the lower pattern. Inspection times respectively required by the inspection modules E1, E2 and E3 are, for example, 36 s, 90 s and 118 s. Since the inspection modules E1, E2 and E3 take different inspection times, respectively, the inspection of a wafer W of a larger number carried into the inspection station S5 later is completed before the inspection of a wafer W of a smaller number carried into the inspection station S5 earlier in some cases.

The transfer arm C of the carrier station S1 can access the transfer stages TRS8 and TRS9. A wafer W carried directly from the transfer stage TRS1 or TRS2 of the processing station S2 by the carrying device 51 or a wafer W inspected by then inspection modules E1 to E3 is transferred to the transfer stage TRS8 or TRS9 and is returned to the carrier 20 by the transfer arm C. A rule of transferring a wafer W to and from the inspection modules E1 to E3 will be described later.

For example, a carrying zone M3 demarcated by, for example, a partition plate is formed above the inspection modules E1 to E3. A transfer stage TRS1A, namely, a third transfer stage that can be accessed by the transfer arm C, is disposed in the carrying zone M3 In FIG. 5, the partition plate is omitted for convenience. A carrying device 52, namely, a shuttle carrying means, is placed in the carrying zone M3. The carrying device 52 receives a wafer W from the transfer stage TRS1A, carries the wafer W directly to and transfers the wafer W to the transfer stage TRS1B of the shelf unit U5 of the processing station S2.

The coating and developing system is provided with a controller 100 including a computer. A series of processes including carrying operations of the main arms A of the blocks B1 to B5 and the carrying devices 51 and 52 of the inspection station is controlled according to a computer program stored in the storage device of the computer. Suppose that the transfer stages TRS, the processing units including the heating units and the inspection modules E1 to E3 to which a Wafer is delivered and from which a wafer W is sent out are designated inclusively by transfer modules. Then, an in-ready signal and an out-ready signal are provided when a wafer W is delivered to and when a wafer W is sent out from each of the transfer modules, respectively. When an in-ready signal is provided for the transfer module, the transfer module is ready to receive a wafer W from the transfer module that executed the preceding process. When an out-ready signal is provided for the transfer module, processing a wafer W by the transfer module is completed and the wafer W is ready to be sent out from the transfer module. Decision to carry a wafer W from which one of the modules to which one of the modules can be made from those ready signals and carrying operations are determined on the basis of the decision and a rule which will be described later.

The controller 100 assigns substrate numbers indicating order of carrying the wafers W to the carrier station Si to twenty-five wafers W when the carrier contains the twenty-five wafers W. The controller 100 determines an inspection schedule shown in FIG. 6 specifying the inspection modules E to be used respectively for inspecting the first wafer No. 1 to the last wafer No. 25 and specifying the wafers W that are not inspected at all.

Figure 7:
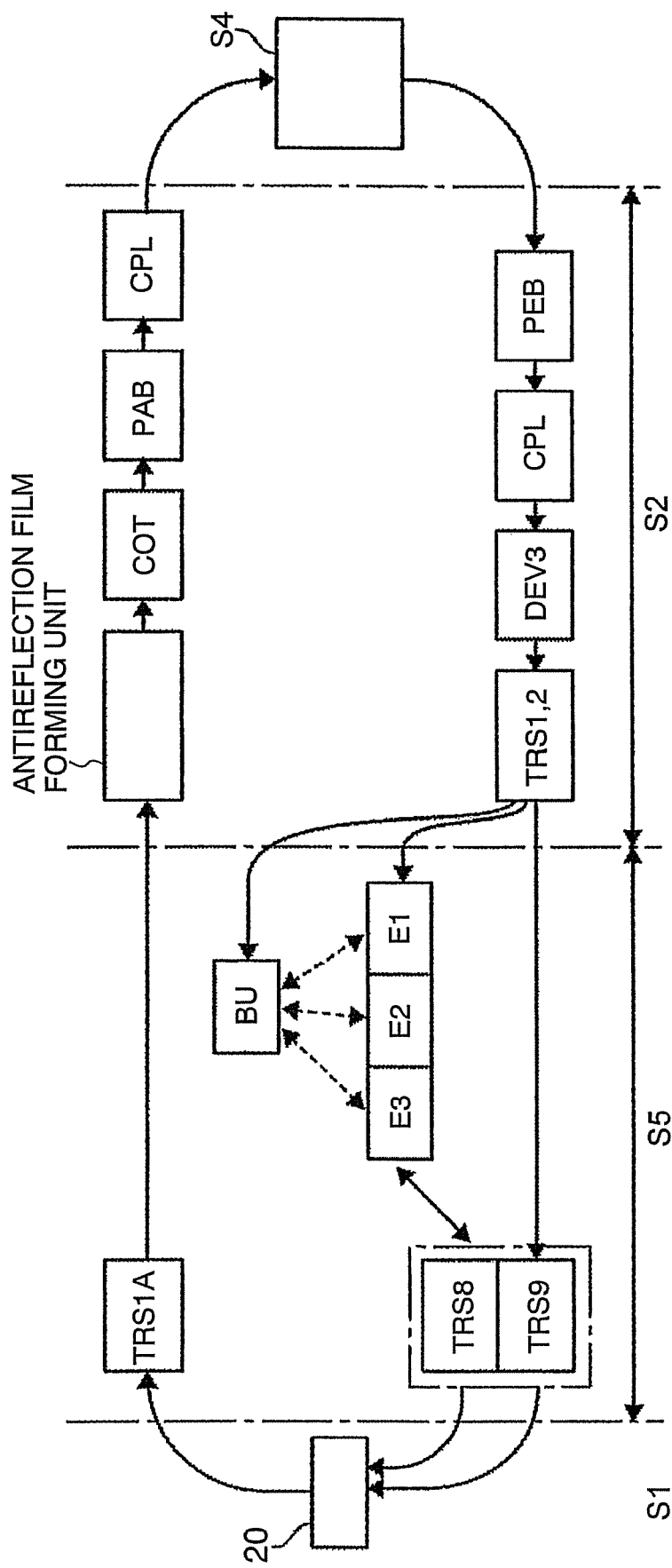
FIG. 7 is a schematic block diagram showing a carrying route in the coating and developing system in the first embodiment.

A wafer carrying route along which a wafer W is to be carried through the carrier station S1 and the processing station S2 will be described with reference to FIG. 7. The transfer arm C of the carrier station S1 carries a wafer W from a carrier 20 to the transfer stage TRS1A of the processing station S2. Subsequently, the wafer W is carried from the transfer stage TRS1A via the carrying device 52, the transfer stage TRS1B of the processing station S2, the transfer arm DI, and the transfer stage TRS3 of the BCT layer B3 to the main arm A3 of the BCT layer B3. A lower antireflection film is formed on the wafer W while the wafer W is carried by the main arm A3 via the cooling unit, the antireflection film forming unit, namely, the wet-processing unit and the heating unit to the transfer stage TRS3 of the shelf unit U5 in the BCT layer B3.

Subsequently, the transfer arm D1 carries the wafer W from the transfer stage TRS3 to the transfer stage TRS4 of the COT layer B4, and then the wafer W is transferred to the main arm A4 of the COT layer B4. While the wafer W is being carried by the main arm A4 to the cooling unit, the coating unit (COT) and the heating unit (PAB) in that order, a resist film is formed on the lower antireflection film. Then, the wafer W is carried to the cooling unit and an edge exposure unit to subject the wafer W to an edge exposure process. Then, the wafer W is carried to the transfer stage TRS4 of the shelf unit U5.

Subsequently, the transfer arm D1 carries the wafer W from the transfer stage TRS4 to the transfer stage TRS5 of the TCT layer B5, and then, the wafer W is transferred to the main arm A5 of the TCT layer B5. In the TCT layer B5, the main arm A5 carries the wafer W to the cooling unit, the second antireflection film forming unit, namely, the wet-processing unit, and the heating unit in that order to form an upper antireflection film on the resist film. Then, the wafer W is carried via the main arm A5, the transfer stage TRS5, the transfer arm D1, the transfer stage TRS1B and the shuttle arm 41 in that order to the transfer stage TRS1C. Then, the interface arm G carries the wafer W to the exposure system S4 to subject the wafer W to a predetermined exposure process.

The foregoing carrying route is only an example. For example, an adhesion promoting unit (ADH) for processing a wafer W by an adhesion promoting process may be included in any one of the blocks B3 to B5, and the wafer W may be carried to TRS1B, ADH, CPL and the coating unit (COT) instead of forming an antireflection film before coating the wafer W with the resist.

The interface arm G carries the wafer W processed by the exposure process to the transfer stage TPS6 or TRS7 of the shelf unit U6. The wafer W is processed by a predetermined developing process by carrying the wafer W from the transfer stage TRS6 (or TRS7) to the heating unit PEB, the cooling unit CPL, the developing unit DEV3, the heating unit 33 and the cooling unit CPL included in the shelf units U1 to U4 of the DEV layer B1 (or B2) in that order by the main arm A1 (or A2) of the DEV layer B1 (or B2) to form a resist pattern. The wafer processed by the developing process is carried to the transfer stage TRS1 (or TRS2) of the shelf unit U5. As mentioned in connection with the description of the related art, when it is supposed that a set of operations executed between carrying wafers W to the carrier station S1 by a carrier 20 and carrying the wafer W to the transfer stage TRS1 (or TRS2) is one cycle and the coating and developing system is supposed to process 150 wafers W per hour. Then, a cycle time in which one cycle is completed is 24 s.

Operations for carrying the wafer W in the inspection station S5 will be described with reference to FIG. 8. FIG. 8(a) is a flow chart of a carrying procedure to be executed every cycle when the controller 100 determines the destination of a wafer W carried to the transfer stage TRS1 (or TRS2). As expressed by the flow chart, the controller 100 determines whether or not the wafer W carried to the transfer stage TRS1 (or TRS2) is to be inspected on the basis of the table shown in FIG. 6. When the wafer W is not to be inspected, the controller 100 controls the carrying device 51 to make the carrying device 51 carry the wafer W to the transfer stage TRS8 or TRS9.

When the controller 100 decides that the wafer W is not to be inspected, the controller 100 decides whether or not the inspection module to be used for inspecting the wafer W is available. When the wafer W is to be inspected by some of the inspection modules, the controller 100 decides whether or not the inspection module of the lowest number is available. The carrying device carries the wafer W to the inspection module if the inspection module is available or to the buffer unit BU if the inspection module is unavailable.

FIG. 8(b) is a flow chart of destination determining procedure to be executed by the controller 100 to determine the respective destinations of the wafers W carried to the inspection modules E1 to E3 and the buffer unit BU. When the controller 100 decides that all the inspections set for the wafer W have been completed, the carrying device 51 carries the wafer W to the transfer stage TRS8 or TRS9. When the controller 100 decides that all the inspections have not been completed, the controller decides whether or not the inspection module for carrying out the inspection not yet executed is available. The wafer W is carried to the inspection module if the inspection module is available or to the buffer unit BU if the inspection module is unavailable. The controller decides whether or not the inspection module to be used for the next inspection of the wafer W held in the buffer unit BU is available and carries the wafer W to the inspection module if the inspection module is available or holds the wafer W in the buffer unit BU if the inspection module is unavailable Description will be made of operations for transferring wafers W to the transfer modules in the inspection station S5 in each cycle when the controller 100 determines carrying operations to carry the wafers Nos. 1 to 25 to the inspection modules according to the inspection schedule shown in FIG. 6.

In cycle No. 1, the wafer No. 1, namely, the first wafer W carrying the resist pattern formed thereon while the wafer W is carried along the foregoing route, is carried to the transfer stage TRS1 or TRS2. In the following description it is supposed that wafers W are carried alternately to the transfer stages TRS1 and TRS2. At this stage, any wafers W are not held in the inspection modules E1 to E3 and the transfer stages TRS8 and TRS9.

In a cycle No. 2, the wafer No. 1 is transferred from the transfer stage TRS2 of the processing station S2 to the carrying device 51. As shown in FIG. 6, it is determined that the wafer No. 1 is to be processed by the inspection module E1. At this stage, the inspection module E1 is available and an in-ready signal is provided by the inspection module E1. the controller 100 makes the carrying deice 51 carry the wafer No. 1 to the inspection module E1 by a carrying procedure represented by the flow chart shown in FIG. 8.

In a cycle No. 3, the wafer No. 2 is transferred from the transfer stage TRS1 to the carrying device 51. As shown in FIG. 6, it is determined that the wafer No. 2 is to be processed by the inspection module E2. At this stage, the inspection module E2 is available and the inspection module E2 provides an in-ready signal. The controller 100 makes the carrying device 51 carry the wafer No. 2 to the inspection module E2 by the carrying procedure represented by the flow chart shown in FIG. 8. The inspection module E1 is in a state where the inspection of the wafer No. 1 has been completed.

In a cycle No. 4, the wafer No. 3 is transferred from the transfer stage TRS2 to the carrying device 51. As shown in FIG. 6, it is determined that the wafer No. 3 is to be processed by the inspection module E3. At this stage, the inspection module E3 is available and the inspection module E3 provides an in-ready signal. The carrying device 51 carries the wafer No. 3 to the inspection module E3 by the carrying procedure represented by the flow chart shown in FIG. 8. In the cycle No. 4, the inspection module E1 completes inspecting the wafer No. 1 and provides an out-ready signal. As shown in FIG. 6, it is determined that the wafer No. 1 is to be inspected only by the inspection module E1 and the transfer stage TRS8 is empty at this stage and provides an in-ready signal. Therefore, the carrying device 51 carries the inspected wafer No. 1 to the transfer stage TRS8 by the carrying procedure represented by the flow chart shown in FIG. 8. The inspection modules E2 and E3 have not yet completed inspecting the wafers Nos. 2 and 3.

In a cycle No. 5, the wafer No. 4 is transferred from the transfer stage TRS1 to the carrying device 51. As shown in FIG. 6, it is determined that the wafer No. 4 is to be processed by the inspection module E1. At this stage, the inspection module E1 is available and the inspection module E1 provides an in-ready signal. The controller 100 makes the carrying device 51 carry the wafer No. 4 to the inspection module E1 by the carrying procedure represented by the flow chart shown in FIG. 8. The wafer transferred to the transfer stage TRS8 is returned to the carrier 20 by the transfer arm C.

In a cycle No. 6, the wafer No. 5 is transferred from the transfer stage TRS2 to the carrying device 51. As shown in FIG. 6, it is determined that the wafer No. 5 is to be processed by the inspection module E1. At this stage, the inspection module E1 is processing the wafer No. 4. In this case, the controller 100 makes the carrying device 51 carry the wafer No. 5 to the buffer unit BU by the carrying procedure represented by the flow chart in FIG. 8.

In a cycle No. 7, the inspection of the wafer No. 4 by the inspection module E1 and the inspection of the wafer No. 2 by the inspection module E2 have been completed and the inspection modules E1 and E2 provide out-ready signals, respectively. Since the wafer No. 2 is not to be inspected any further as shown in FIG. 6, the controller 100 makes the carrying device 51 carry the wafer No. 2 to the transfer stage TRS8 by the carrying procedure represented by the flow chart shown in FIG. 8, and the inspection modules E1 and E2 provide in-ready signals, respectively. The wafer No. 4 is to be inspected by the inspection module E3. However, the inspection module E3 is engaged in inspecting the wafer No. 3 in the cycle No. 7. Therefore, the controller 100 makes the carrying device 51 carry the wafer No. 4 to the buffer unit BU. Subsequently, the carrying device 51 carries the wafer No. 5 carried to the buffer unit BU in the preceding cycle No. 6 to the available inspection module E1.

In the cycle No. 7, the wafer No. 6 is transferred from the transfer stage TRS1 to the carrying device 51. As shown in FIG. 6, the wafer No. 6 is to be inspected by the inspection module E2. The inspecting module E2 is available at this stage and provides an in-ready signal at this stage. The controller 100 makes the carrying device 51 carry the wafer No. 6 to the inspection module E2 by the carrying procedure represented by the flow chart in FIG. 8.

In a cycle No. 8, the inspection module E3 is engaged in inspecting the wafer No. 3. Therefore, the wafer No. 4 stored in the buffer unit BU in the preceding cycle is kept continuously in the buffer unit BU. A wafer No. 7 is transferred from the transfer stage TRS2 to the carrying device 51. As shown in FIG. 6, the wafer No. 7 is to be inspected by the inspection module E1. However, the inspection module E1 is engaged in inspecting the wafer No. 5. Therefore, the controller 100 makes the carrying device 51 carry the wafer No. 7 to the buffer unit BU by the carrying procedure represented by the flow chart in FIG. 8.

In a cycle No. 9, the inspection modules E1 and E3 complete processing the wafers Nos. 5 and 3 and provide out-ready signals, respectively. For example, the carrying device 51 carries the wafer No. 3 of a lower number to the transfer stage TRS8 and carries the wafer No. 5 to the transfer stage TRS9. The wafer No. 8 is transferred from the transfer stage TRS1 to the carrying device 51. As shown in FIG. 6, it is determined that the wafer No. 8 is to be processed by the inspection module E1. At this stage, the inspection module E1 is engaged in inspecting the wafer No. 7. Therefore, the controller 100 makes the carrying device 51 carry the wafer No. 8 to the buffer unit BU.

Figure 8:
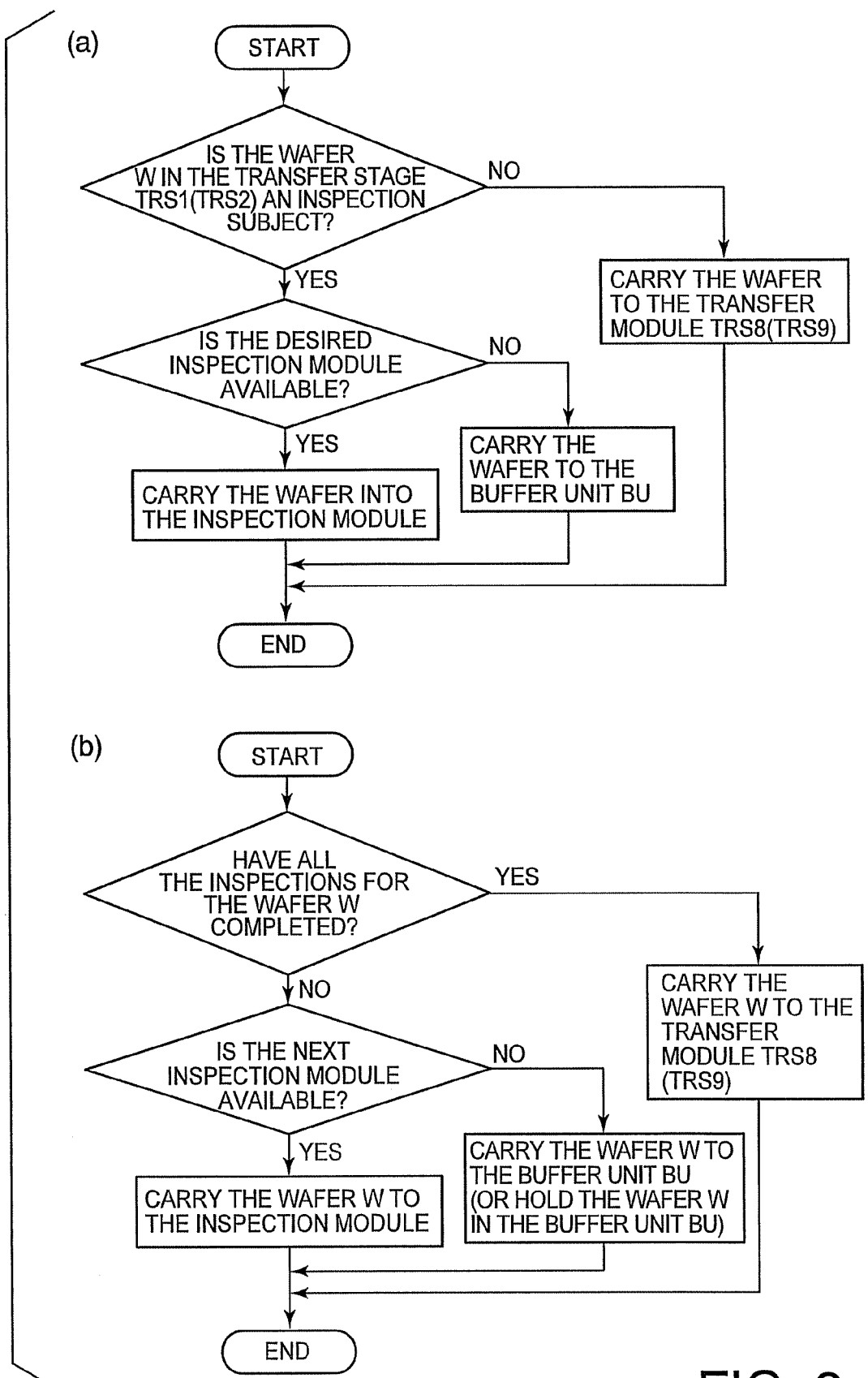
FIG. 8 is a flow chart of a control procedure to be executed by the controller to control a carrying device included in the inspection station.
Figure 9:
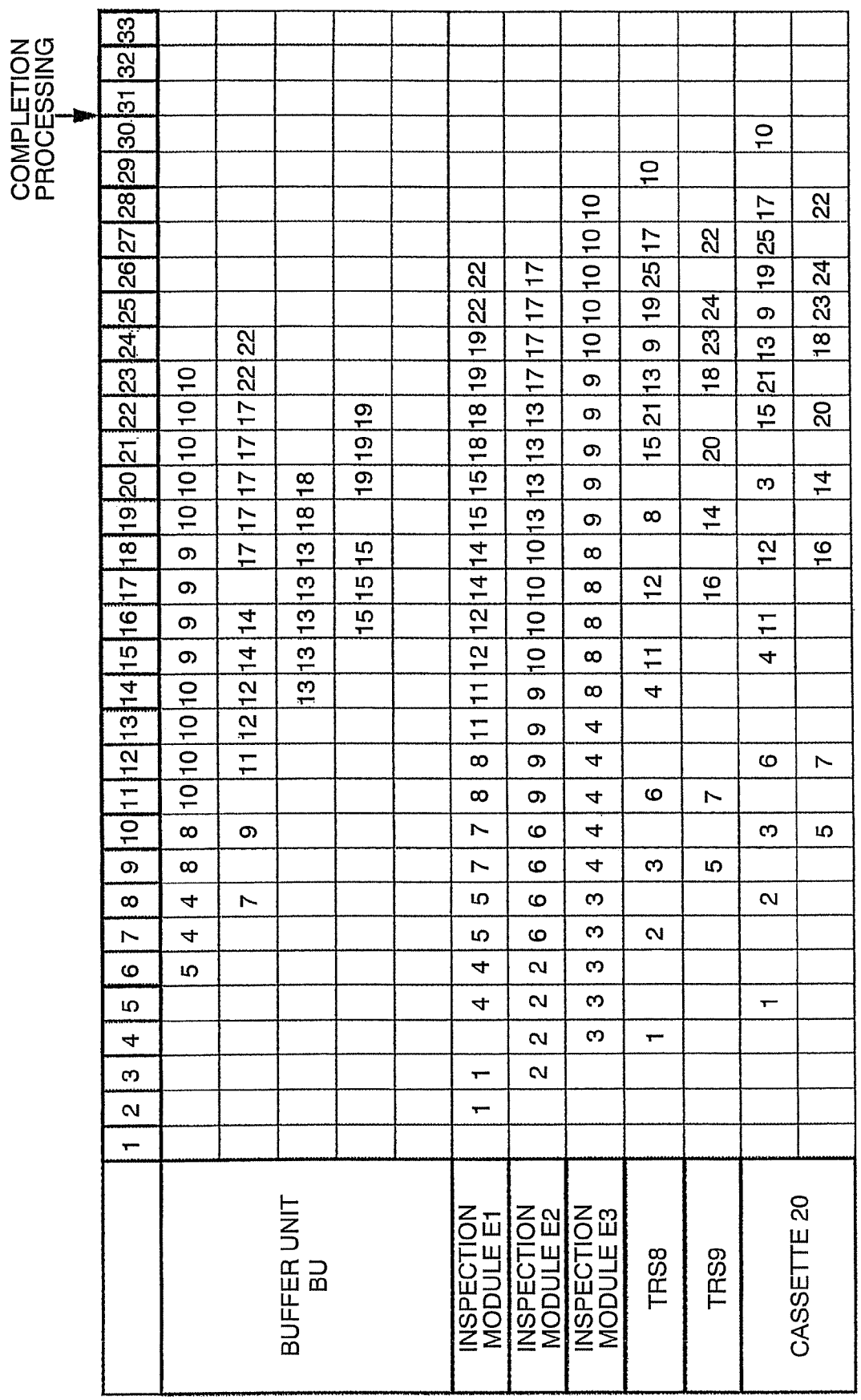
FIG. 9 is a table of a carrying schedule specifying carrying operations in the coating and developing system in the first embodiment.

Although the description of cycles after the cycle No. 9 are omitted, the controller 100 continues controlling the carrying device 51 by the carrying procedure represented by the flow chart in FIG. 8. FIG. 9 is a table showing the results of operations for carrying the wafers Nos. 1 to 25 by the foregoing carrying procedure. FIG. 9 shows the wafers W placed in the transfer stages TRS8 and TRS9, and the inspection modules E1, E2 and E3 in each of the cycles. As obvious from the table shown in FIG. 9, operations for processing the twenty-five wafers W are completed in thirty cycles. The wafers W thus processed are returned to the carrier 20.

In this coating and developing system, the inspection station S5 that transfers the wafers W processed in the processing station S2 to the carrier station is provided with the inspection modules E1 to E3 that execute different inspections taking different inspection times, respectively, and the buffer unit BU fore temporally holding wafers W. When the succeeding wafer W to be inspected by the inspection module is carried into the inspection station S5 while the same inspection module is engaged in inspecting the preceding wafer W, the succeeding wafer W is carried to and is stored temporarily in the buffer unit BU. Thus, holding the wafers W in the inspection modules E1 to E3 can be suppressed. This carrying procedure does not require the transfer arm C to carry a wafer W returned to the carrier 20 back to the inspection station S5 for inspection. Thus, load on the transfer arm C can be reduced and the reduction of the throughput can be suppressed.

The inspection station S5 is provided with the transfer stages TRS8 and TRS9 through which a wafer W is transferred from the inspection station S5 to the carrier station S1. A wafer W is carried to the transfer stage TRS9 when the transfer stage TRS8 is occupied by a wafer W in each cycle to avoid holding wafers W in the inspection modules E1 to E3 on the upstream side of the transfer stages TRS8 and TRS9, which can suppress the reduction of the throughput.

The carrying device 51 carries a wafer W from the carrier station S1 to the processing station S2 and the carrying device 52 is not used for this carrying operation for carrying a wafer W between the stations S1 and S2. Thus, load on the carrying device 52 is reduced and the throughput can be improved.

Figure 10:
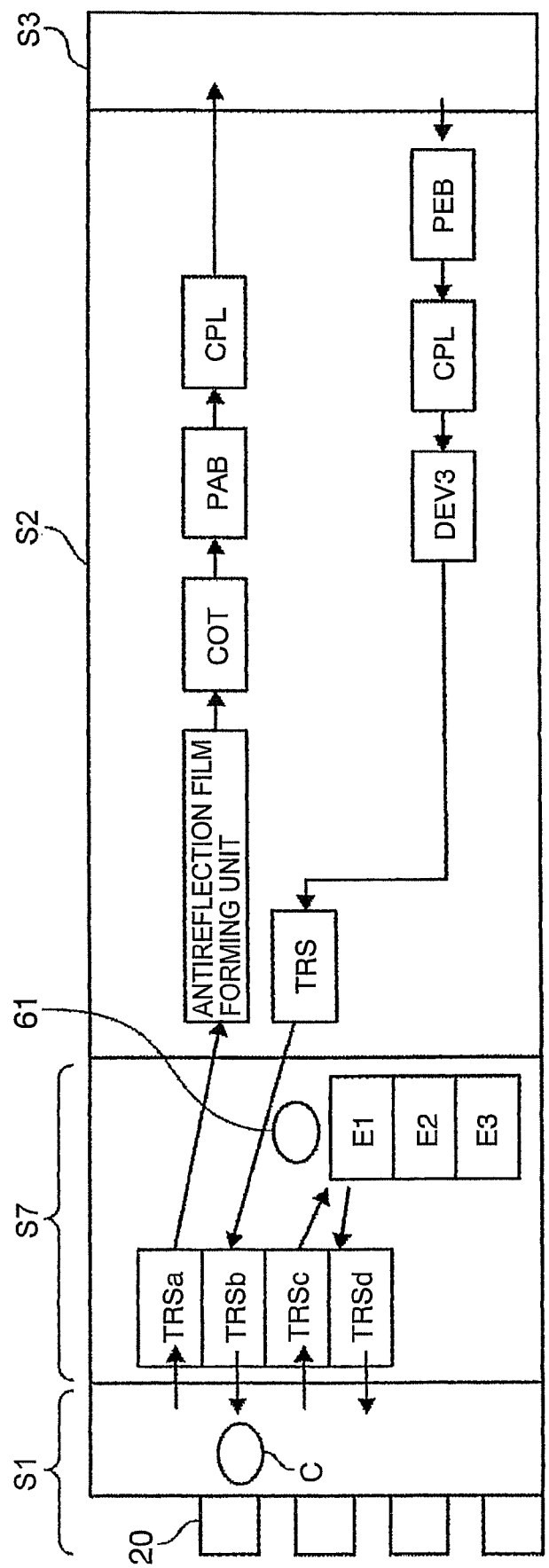
FIG. 10 is a schematic block diagram of a carrying route in a coating and developing system in a comparative example.

A coating and developing system in a comparative example will be described with reference to FIG. 10. FIG. 10 is a schematic sectional plan view of the coating and developing system. this coating and developing system has a carrier station S1, a processing station S2 and an interface station S3, which are substantially similar to those of the foregoing coating and developing system, and carries a wafer W similarly to the foregoing coating and developing system.

This coating and developing system has an inspection station S7. The inspection station S7 includes four transfer modules TRSa to TRSd, inspection modules E1 to E3, and a carrying device 61 for carrying a wafer to and from the modules TRSa to TRSd, E1 to E3 and transfer stages of a shelf module, which will be described later.

As shown in FIG. 10, the coating and developing system in the comparative example, similarly to the coating and developing system in the first embodiment, forms a resist pattern on a wafer W by carrying the wafer W to an antireflection film forming unit, COT, PAB, CPL, the interface station S3, an exposure system S4, the interface station S3, PEB, CPL and a DEV3 in that order. After the resist pattern has been thus formed on the wafer W, the wafer W is carried to the transfer stage TRS of the processing station S2.

The carrying device 61 carries the wafer W delivered to the transfer stage TRS in conformity with the following rule.

The carrying device 61 is controlled so as to conform to the following rules:

a) priority is given to transferring a wafer W between the carrier station S1 and the processing station S2, b) wafers W to which lower numbers indicating processing order are assigned are carried earlier to the inspection modules E1 to E3, and c) wafers W whose inspections have been completed are carried away from the inspection modules E1 to E3 regardless of the numbers indicating processing order and assigned to the wafers W.

A transfer arm C included in the carrier station S1 carries out the following carrying operations.

a) receiving an unprocessed wafer W from the carrier station S1 and transferring the unprocessed wafer W to the transfer module TRSa, b) receiving a processed wafer W from the transfer module TRSb and returning the processed wafer W to a carrier 20, c) transferring the processed wafer W from the carrier 20 to the transfer module TRSc, and d) returning an inspected wafer W from the transfer module TRSd to the carrier 20.

Figure 11:
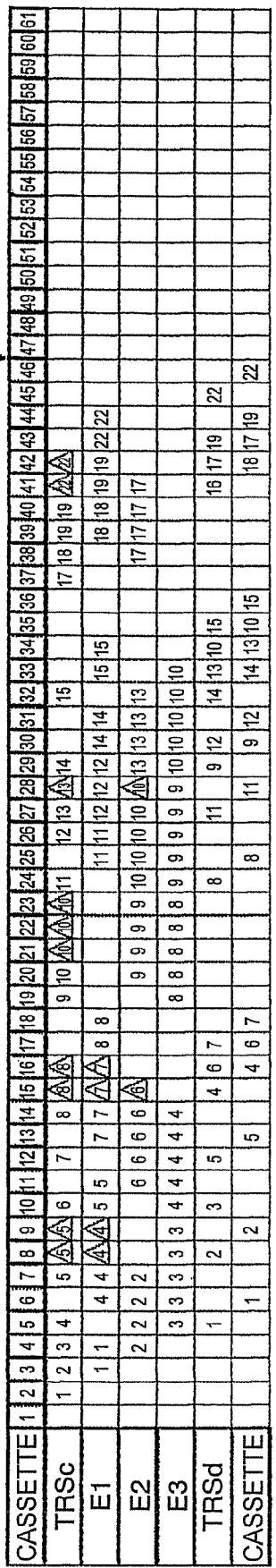
FIG. 11 is a table of a carrying schedule specifying carrying operations in the coating and developing system in the comparative example.

FIG. 11 is a table showing the results of operations for carrying wafers W to be inspected as shown in FIG. 6 in the coating and developing system in the comparative example. It is known from the examination of a row corresponding to the transfer module TRSc, any wafer W is not carried into the transfer module TRSc in some cycles including cycles 6, 11 and 13. Such cases occur when the transfer arm C is engaged in other carrying operations and cannot carry any wafer W into the transfer module TRSc. In the table shown in FIG. 11, a triangle indicates a state where a wafer W is held in the next module to which a wafer W in the present module is to be carried and the latter wafer W is inevitably held in the present module. In such a state, any wafer W is not carried into the inspection modules E1 to E3 in some cycles. Consequently, the coating and developing system in the comparative example needs to carry out forty-six cycles greater than those needed by the coating and developing system in the first embodiment to complete processing twenty-five wafers W.

Figure 12:
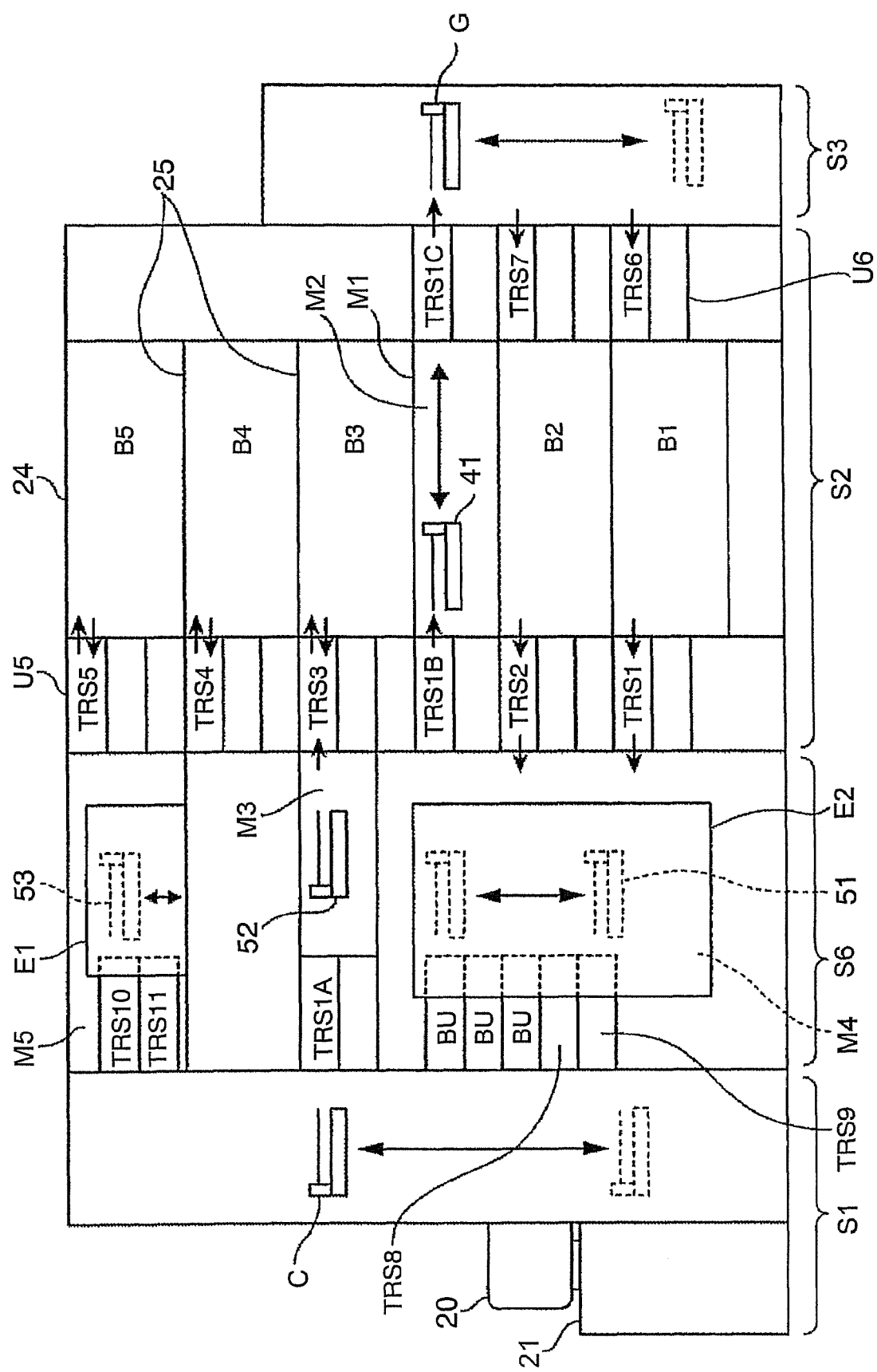
FIG. 12 is a longitudinal sectional view of a coating and developing system in a second embodiment according to the present invention.

FIG. 12 shows a coating and developing system in a second embodiment according to the present invention, in which parts like or corresponding to those of the coating and developing system in the first embodiment are designated by the same reference characters. This coating and developing system includes an inspection station S6 substantially similar to the inspection station S5. The construction of the inspection station S6 will be described mainly in terms of parts and matters different from those of the inspection station S5. Suppose that a carrying device 51 operates in a carrying zone M4. The inspection station S6 of the coating and developing system is not provided with any module corresponding to the inspection module E1, A plurality of buffer units BU are mounted on stacked transfer modules TRS8 and TRS9.

The carrying device 52 moves through the carrying zone M3 and transfers a wafer W to a transfer stage TRS3 included in a BCT layer B3. The wafer W transferred to the transfer stage TRS3 is carried along a route similar to that mentioned in the description of the first embodiment to subject the wafer W to processes in the layers and then, the wafer W is carried to the transfer stage TRS1 (TRS2). A demarcated carrying zone M5 in which a carrying device 53 carries a wafer W is formed above the carrying zone M3.

Figure 13:
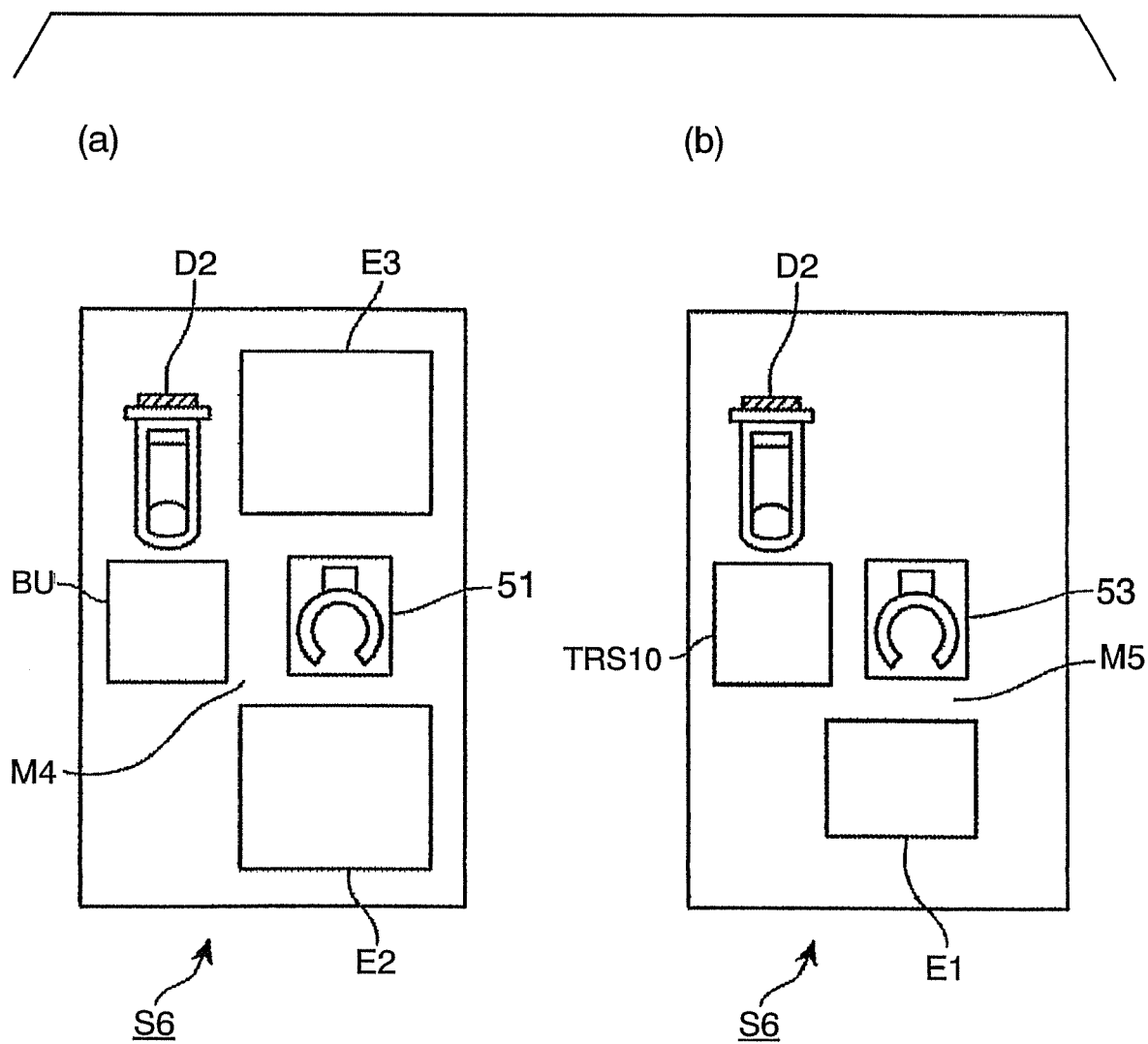
FIG. 13 is a sectional plan view of an inspection station included in the coating and developing system in the second embodiment.
Figure 14:
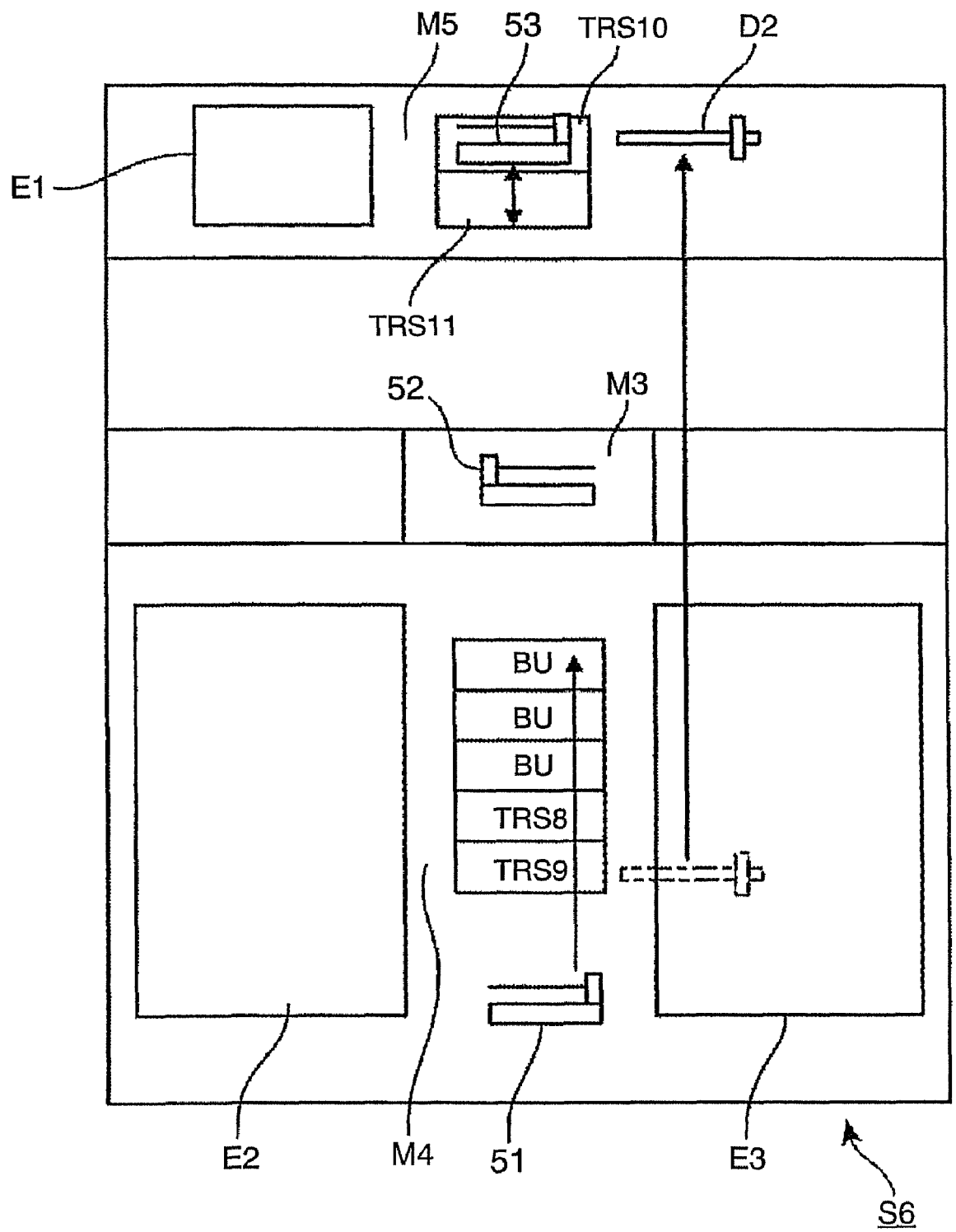
FIG. 14 is a sectional rear view of the inspection station shown in FIG. 13.

The carrying zones M4 and M5 will be described with reference to FIGS. 13 and 14. FIGS. 13(*a*) and 13(*b*) show the carrying zones M4 and M5, respectively, and FIG. 14 is a view of the inspection station S6 taken in a direction from a processing station S2 toward a carrier station S1. The carrying device 53 is installed in a central part of the carrying zone M5. Transfer stages TRS10 and TRS11 are stacked in layers on the front side (on the carrier station S1 side) of the carrying device 53. The inspection module E1 is disposed on the right facing the processing station S2. the carrying device 53 can turn about a vertical axis and can move in vertical directions and longitudinal directions to carry a wafer W to and from the transfer stages TRS10 and TRS11, and the inspection module E1.

As shown in FIG. 14, a transfer arm D2 can move between the carrying zones M1 and M2 in the inspection station S6. The transfer arm D2 carries a wafer W to and from the transfer stages TRS8 to TRS11 and the buffer unit BU. A rule of transferring a wafer W in the inspection station S6 is the same as the rule of transferring a wafer W mentioned in the description of the first embodiment. However, a carrying route is somewhat different from that in the first embodiment. A wafer W is carried from the transfer stage TRS1 (TRS2) to the inspection module E1 via the carrying device 51, the buffer unit BU, the transfer arm D2, the transfer stage TRS10 or TRS11, the carrying device 53 in that order to the inspection module E1.

A wafer W is carried from the inspection module E1 to the buffer unit BU by reversely following the route for carrying a wafer W to the inspection module E1. A wafer W is carried from the inspection module E1 to the inspection module E2 (E3) by carrying the wafer to the buffer unit BU along the foregoing route for carrying a wafer to the buffer unit BU, and then, the wafer W is carried from the buffer unit BU to the inspection module E2 (E3) by the carrying device 51. The effect of the second embodiment including the thus constructed inspection station S6 is the same as the first embodiment.

Figure 15:
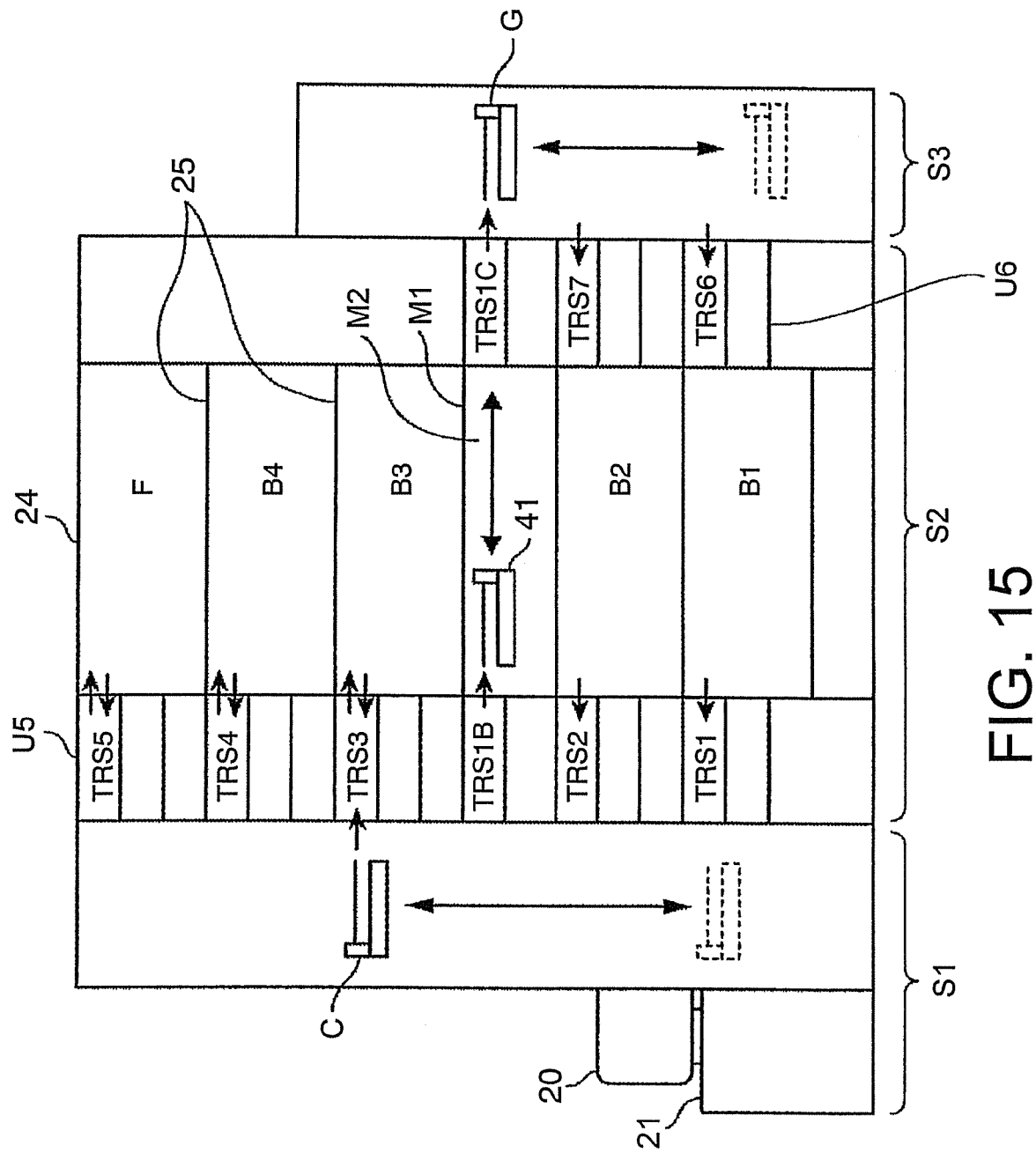
FIG. 15 is a longitudinal sectional view of a coating and developing system in a third embodiment according to the present invention.

FIG. 15 shows a coating and developing system in a third embodiment according to the present invention. This coating and developing system does not have an inspection station. In the third coating and developing system, a transfer arm C transfers a wafer W from a carrier 20 to a transfer stage TRS3 included in a BCT layer B3. The coating and developing system does not have a TCT layer B5. A wafer transferred to the transfer stage TRS3 is carried along the route in the foregoing embodiment to form a resist film on the wafer W. The wafer W is carried to a transfer stage TRS4 and then to a transfer stage TRS1B, Then, the wafer W is carried along the foregoing route to a transfer stage TRS1 (TRS2) included in a DEV layer B1 (B2).

Figure 16:
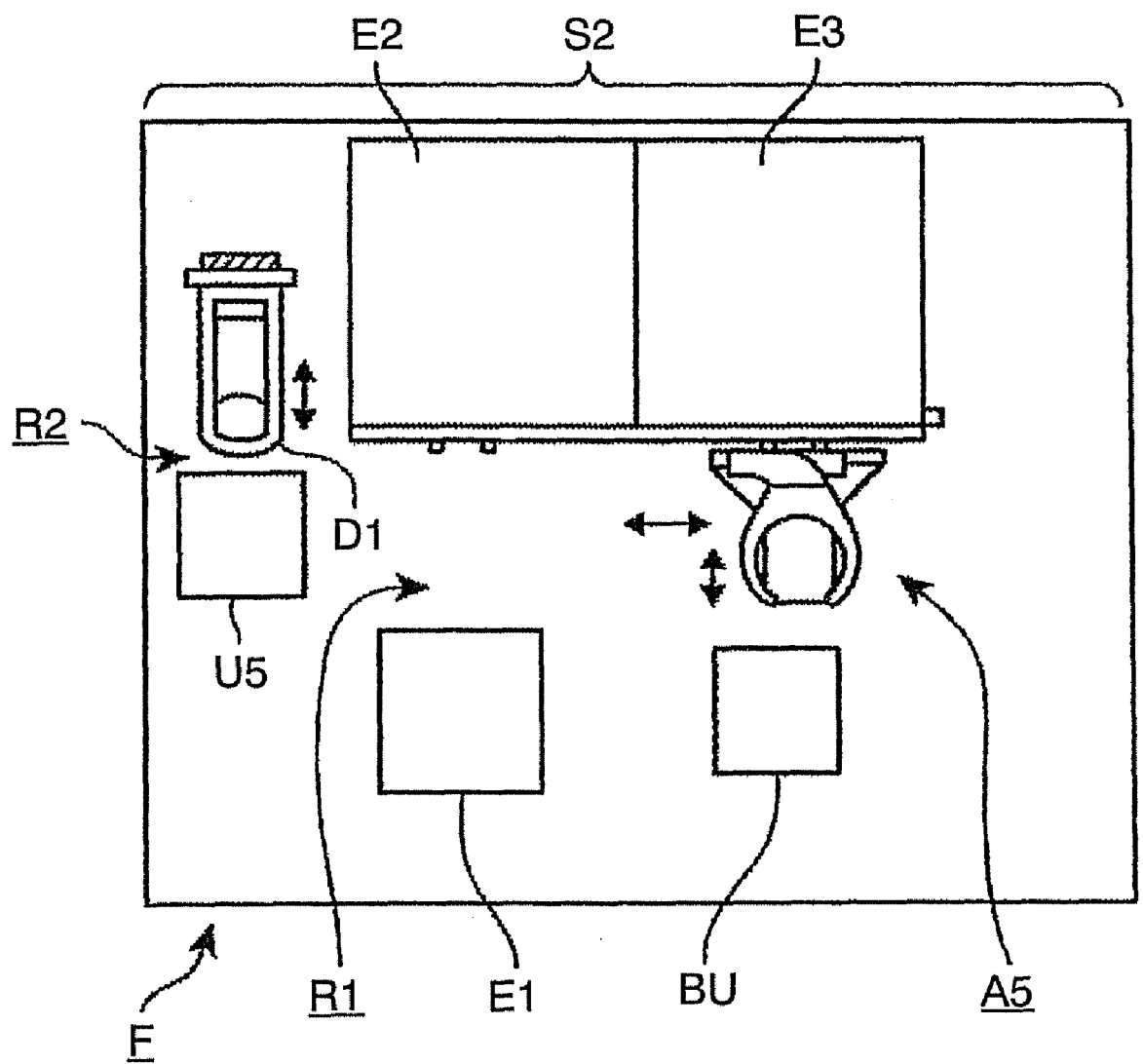
FIG. 16 is a sectional plan view of an inspection layer included in the coating and developing system in the third embodiment.

The coating and developing system is provided with an inspection layer F instead of the TCT layer. FIG. 16 shows the inspection layer F by way of example. Matters relating to the inspection layer F different from other layers will be described. The inspection layer F is provided with inspection modules E2 and E3 instead of shelf units U1 to U4, is not provided with any wet-processing unit, is provided with an inspection module E1 and a plurality of buffer units BU stacked in layers. The inspection module E1 and the stacked buffer units BU are arranged along a carrying passage R1. A main arm A5 carries a wafer to and from the buffer units BU and the inspection modules E1 to E3.

In this coating and developing system, a wafer W carried to the transfer stage TRS1 (TRS2) and expected to be inspected is carried via a transfer arm D1, a transfer stage TRS5, a main arm A5 according to the foregoing rule to the desired one of the inspection modules E1 to E3 or to the buffer unit BU. A wafer W carried to the transfer stage TRS1 (TRS2) and not expected to be inspected is returned to a carrier 20 by the transfer arm C.

A coating and developing system in a fourth embodiment according to the present invention will be described. The coating and developing system in the fourth embodiment is supposed to be the same in construction as the coating and developing system in the first embodiment excluding the following different matters. The buffer unit BU of the first embodiment has a capacity to store all the wafers W carried into the inspection station S5 and cannot be immediately delivered to the inspection modules E. A buffer unit BU of the fourth embodiment is expected to store only some of wafers W that cannot be delivered to the inspection modules.

Figure 17:
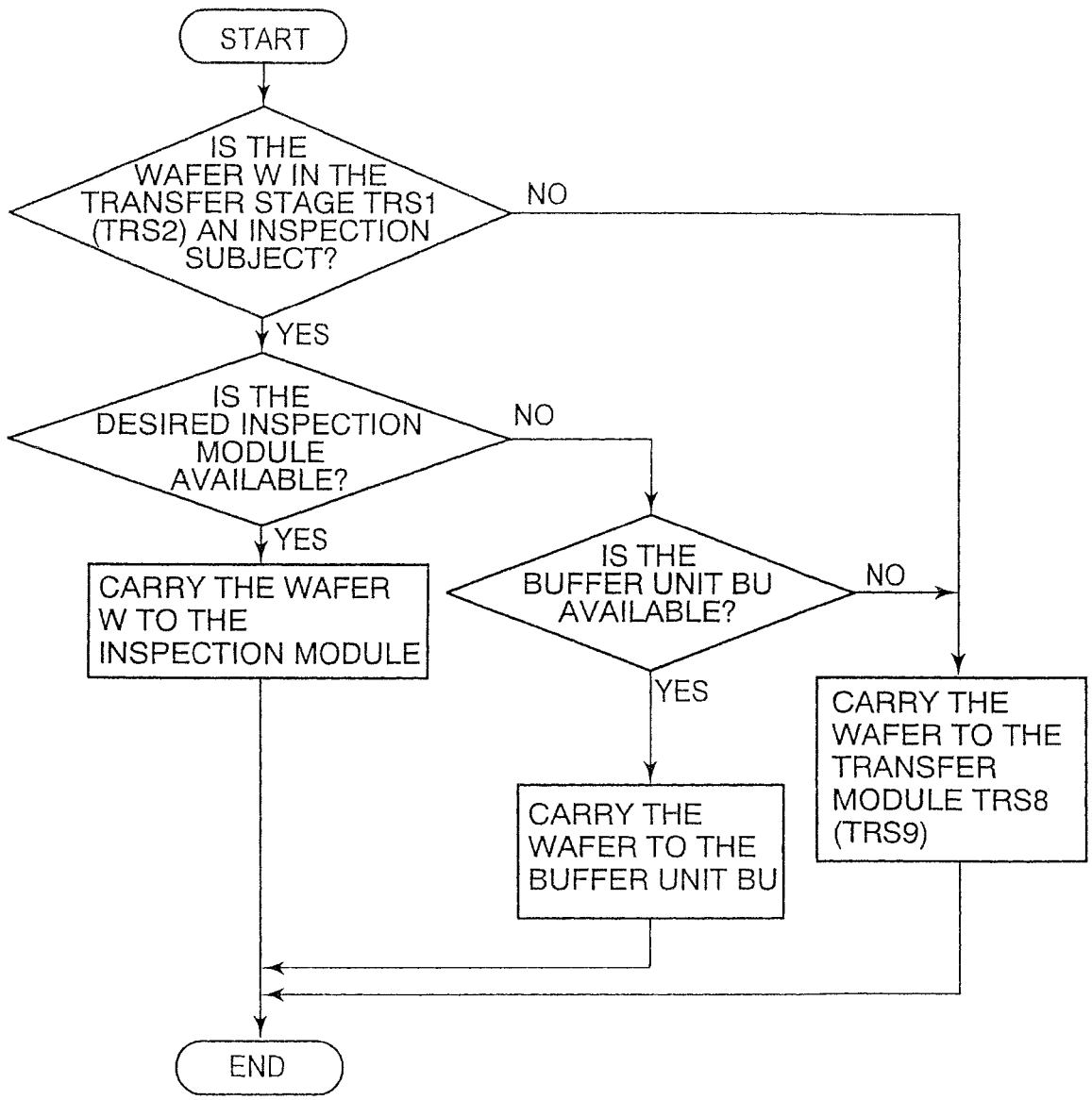
FIG. 17 is a flow chart of assistance in explaining another carrying route in the inspection station.

FIG. 17 is a flow chart of a destination determining procedure to be executed by a controller 100 in each cycle for a wafer W delivered to a transfer stage TRS1 (TRS2) of the fourth embodiment. The controller 100 decides whether or not a wafer W carried to the transfer stage TRS1 (TRS2) is to be inspected. The controller 100 decides whether or not the inspection module by which the wafer W is to be inspected is available when it is decided that the wafer W is to be inspected. If the inspection module is unavailable, the controller 100 decides whether or not the buffer unit BU has a room to store the wafer W.

If it is decided that the buffer unit BU has a room to store the wafer W, the controller 100 makes a carrying device 51 carry the wafer W to the buffer unit BU. If it is decided that the buffer unit BU has no room to store the wafer W, the controller 100 makes the carrying device 51 carry the wafer W to the transfer stage TRS8 (TRS9). The wafer W carried to the transfer stage TRS8 (TRS9) is returned to a carrier 20 by a transfer arm C. Thus, a wafer W as an inspection subject is returned to the carrier 20 without inspecting the wafer W when the inspection module E is unavailable and the buffer unit BU does not have any room to store the wafer W. The fourth embodiment, similarly to the first embodiment, transfers a wafer W not to be inspected from the transfer stage TRS1 (TRS2) to the transfer stage TRS8 (TRS9) and transfers a wafer W to be inspected to the inspection module E if the inspection module E is available.

The fourth embodiment is provided with, for example, an alarm unit and a monitor for monitoring the condition of the coating and developing system. When a wafer W to be inspected is returned to the carrier 20 without being inspected because the desired inspection module E is unavailable and the buffer unit BU does not have any room to store the wafer W, the controller 100 stores a substrate number assigned to the wafer W and gives a control signal to the alarm unit to make the alarm unit generate an alarm. The controller 100 makes the monitor display the stored substrate number.

Figure 18:
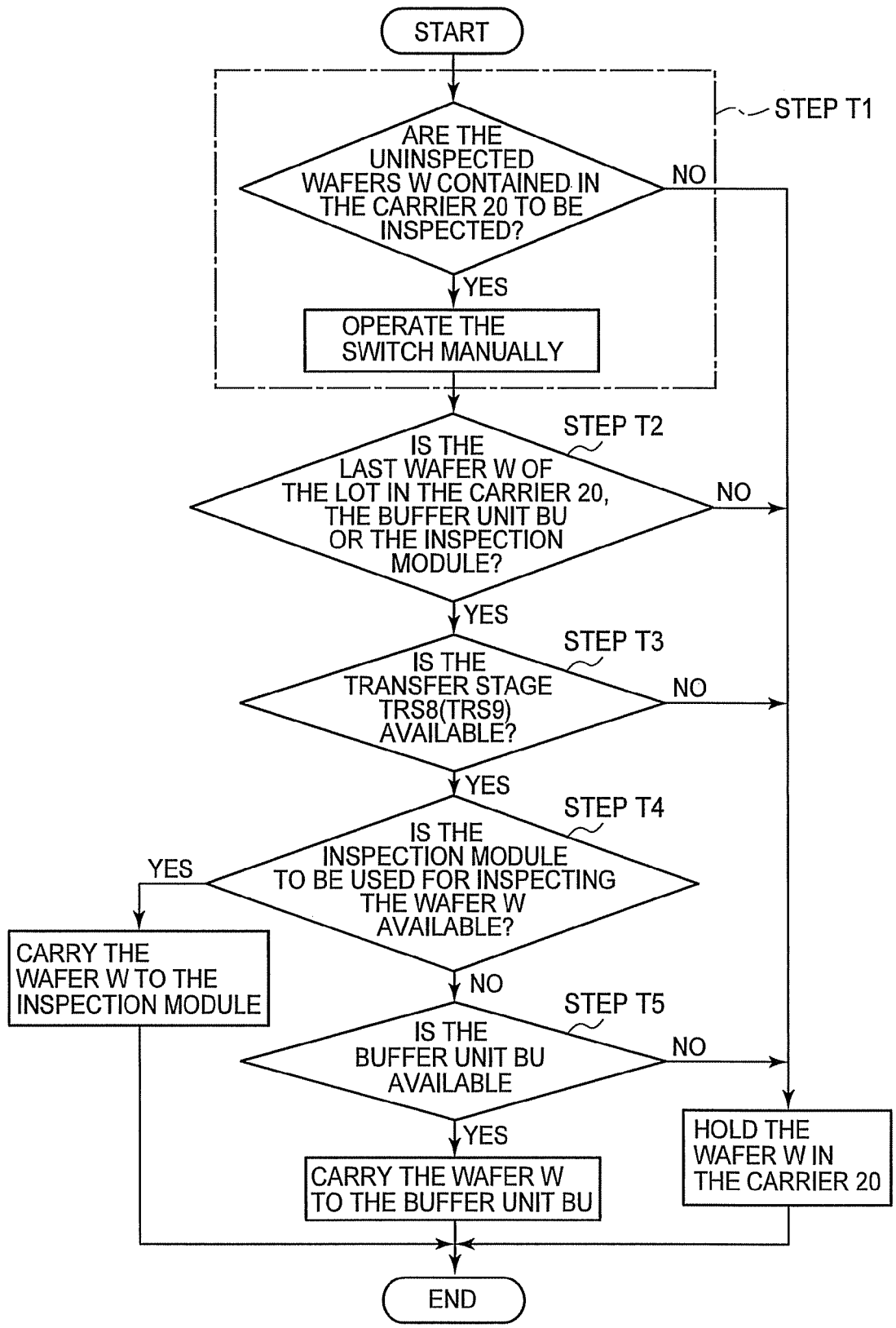
FIG. 18 is a flow chart of assistance in explaining a carrying route along which a substrate is carried from a carrier station to an inspection station in a coating and developing system.
Figure 19:
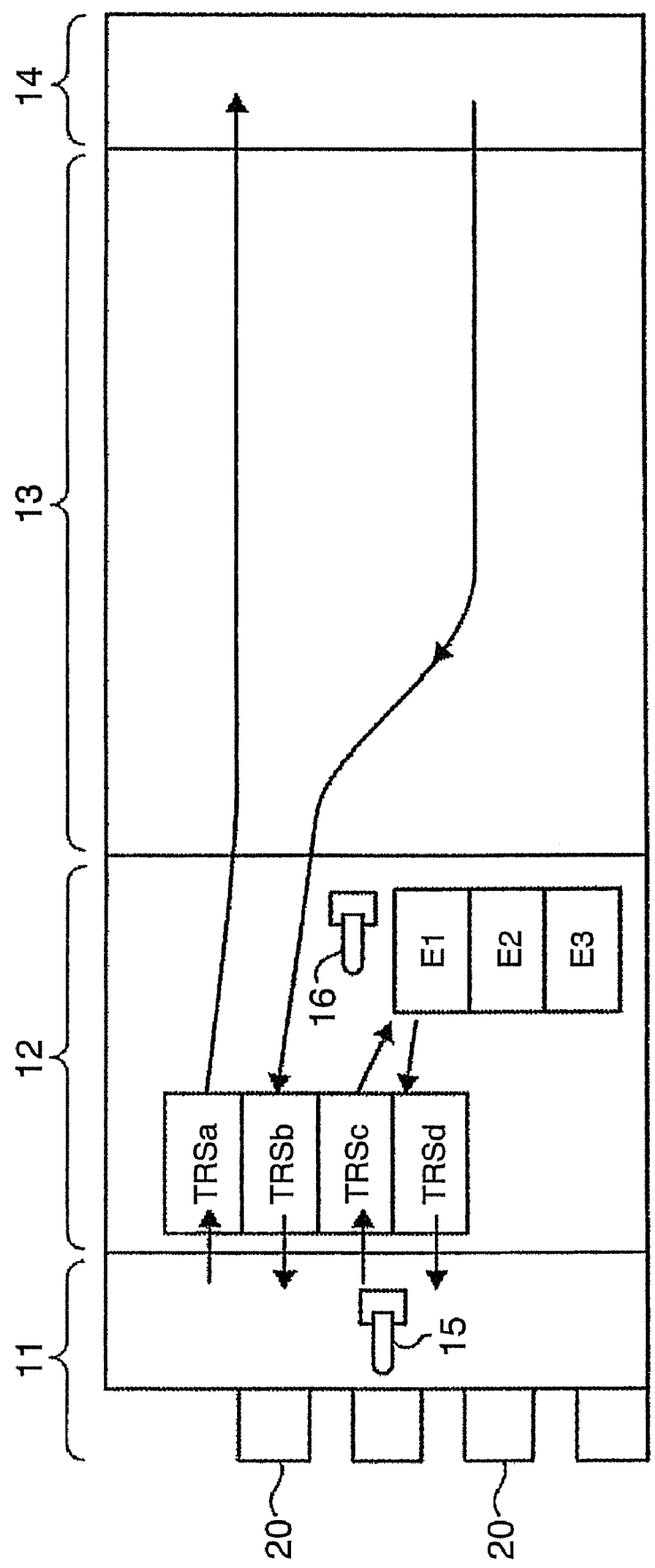
FIG. 19 is a schematic diagram of a carrying route in a prior art coating and developing system.

The coating and developing system in the fourth embodiment can carry the wafer W of the number stored in the controller 100 again to the inspection station S5 to inspect the wafer W. FIG. 18 is a flow chart of a carrying and inspecting procedure for carrying and inspecting the wafer W as mentioned above. In FIG. 18, a part encircled by a dotted line is step T1. Step T1 is executed by the manual operation of the operator of the coating and developing system after an alarm has been generated. Steps following step T1 are executed automatically according to a carrying program stored in the controller 100.

For example, the coating and developing system is provided with a switch, namely, a selecting means for selecting whether or not the wafer of the substrate number displayed by the monitor not yet inspected (hereinafter, referred to as "uninspected wafer") is to be inspected. The wafer W contained in the carrier 20 is held in the carrier 20 unless the operator operates the switch. When the operator closes the switch, the carrying program is executed and the controller 100 makes decisions in steps T following step T1 shown in FIG. 18 every cycle. First, the controller 100 decides whether or not the last one of the wafers W of the lot contained in the carrier 20, namely, the wafer "25", is in any one of the carrier 20, the buffer unit BU and the inspection module E in step T2. When the response to the query in step T1 is negative, the uninspected wafer W remains kept in the carrier 20.

If the wafer No. 25 is in any one of the carrier 20, the buffer unit BU and the inspection module E, the controller 100 decides whether or not the transfer stage TRS8 or TRS9 is available in step T3. If it is decided in step T3 that the transfer module TRS8 or TRS9 is unavailable, the uninspected wafer remains kept in the carrier 20.

If it is decided in step T3 that the transfer stage TRS8 or TRS9 is available, the controller 100 makes a decision whether or not the inspection module E for inspecting the uninspected wafer W is available in step T4. If a plurality of uninspected wafers W are contained in the carrier 20, the decision is made for the uninspected wafer of the lowest number. If it is decided that the inspection module E is available, the uninspected wafer of the lowest number is transferred to the transfer arm C, the transfer stage TRS8 (TRS9) and the carrying device 51 in that order after a carrying operation for carrying a wafer in the inspection station S5 in the cycle in which the controller 100 made the decision has been completed. The carrying device 51 carries the uninspected wafer to the inspection module E.

If it is decided that the inspection module E expected to inspect the uninspected wafer is unavailable, the controller 100 decides whether or not the buffer unit BU is available in step T5. If the buffer unit BU is unavailable, the uninspected wafer remains kept in the carrier 20. If the buffer unit BU is available, the uninspected wafer is transferred to the transfer arm C, the transfer stage TRS8 (TRS9) and the carrying device 51 in that order after a carrying operation for carrying a wafer in the inspection station S5 in the cycle in which the controller 100 made the decision has been completed. The carrying device 51 carries the uninspected wafer to the buffer unit BU.

The uninspected wafer carried to the buffer module BU and the inspection module E is carried by the carrying procedure represented by the flow chart shown in FIG. 8(b) described in connection with the foregoing embodiment. As mentioned above, priority is given to carrying the uninspected wafer of a lower number in the inspection station S5. However, for example, carrying wafers other than the uninspected wafer has priority over carrying the uninspected wafer. When there are some uninspected wafers, priority is given to carrying uninspected wafers of lower numbers. Suppose that the wafers Nos. 13 and 14 are uninspected wafers and the wafer No. 25 is not an uninspected wafer. Then, the wafers No. 25, the wafer No. 13 and the wafer No. 14 are carried in that order to the modules of the inspection station S5 by the carrying procedure represented by the flow chart shown in FIG. 8(b).

In this coating and developing system, only some of the wafers W to be inspected are returned from the carrier station S1 to the inspection station S5. Consequently, the reduction of throughput can be suppressed. When there are several uninspected wafers, the operator may selectively decide whether or not each uninspected wafer is to be inspected.

Whether or not the uninspected wafers are to be inspected may be determined, for example, before the carrier 20 is carried into the coating and developing system instead of deciding whether or not the uninspected wafers are to be inspected through the operator's manual operation after an alarm has been given. In the foregoing embodiment, there is the possibility that the last one of the wafers of the lot is not inspected, and the uninspected last wafer is returned to the carrier 20. Therefore, whether or not there are any wafers W in the carrier 20, the buffer unit BU and the inspection module E and a carrying operation for carrying the uninspected wafer to the inspection station S5 is started after deciding that all the wafers contained in the carrier 20 are not to be inspected or to be inspected. Thus, the uninspected wafers are carried to the inspection station S5 after the condition of the inspection station S5 has been substantially confirmed. The mode of timing carrying the uninspected wafer is not limited to the foregoing mode; steps T2 to T5 may be executed and the uninspected wafer may be carried to the inspection station S5 before that, for example, steps T3 to T5 may be executed and the uninspected wafer may be carried to the inspection station S5 at the time when the middle one of the wafers W of the lot contained in the carrier 20 is carried to one of the modules of the inspection station,

The invention claimed is:

1. A coating and developing system control method of controlling a coating and developing system including:
   a carrier station holding carriers each containing a plurality of substrates, and provided with a first substrate carrying means for taking out a substrate from and putting a substrate into the carrier;
   a processing station including a plurality of processing modules for applying a resist to a substrate received from the first carrying means and for processing a substrate coated with the resist and processed by an exposure process by a developing process or processing the substrate by processes before and after the developing process, and provided with a second substrate carrying means for carrying a substrate to the processing modules in sequence;
   a first transfer unit for holding a substrate processed by the developing process in the processing station;
   a second transfer unit from which a substrate is received by the first carrying means of the carrier station; and
   an inspection station, through which a substrate processed in the processing station is transferred to the carrier station, including
       a plurality of inspection modules that take different inspection times, respectively,
       a buffer unit for temporarily holding a substrate, and
       a third substrate carrying means for carrying a substrate to and from the buffer unit, the first transfer unit, the second transfer unit and the inspection modules;
   said control method comprising steps to be executed when the substrate in the first transfer unit is carried including:
   (a1) deciding whether or not a substrate is an inspection subject,
   (a2) carrying the substrate to the second transfer unit when the substrate is not an inspection subject, and
   (a3) deciding whether or not an inspection module for inspecting the substrate is available when the substrate is an inspection subject and carrying the substrate to the available inspection module when the inspection module is available or carrying the substrate to the buffer unit when the inspection module is unavailable, wherein when it is decided in step (a3) that the inspection module is unavailable, instead of carrying out the step of carrying the substrate to the buffer unit,
   it is decided whether or not the buffer unit is available, and
   carrying the substrate to the buffer unit when it is decided that the buffer unit is available or
   carrying the substrate as an uninspected substrate to the second transfer unit by the third substrate carrying means and making the third substrate carrying means prepare for carrying a substrate placed on the first transfer unit, the second transfer unit or the inspection modules when it is decided that the buffer unit is unavailable; and
   steps to be executed when a substrate in the module of the inspection station is carried including:
   (b1) deciding whether or not all the inspections assigned to the substrate have been completed,
   (b2) carrying the substrate to the second transfer unit when all the inspections assigned to the substrate have been completed, and
   (b3) deciding whether or not the inspection module for carrying out an inspection is available when all the inspections assigned to the substrate have not been completed and carrying the substrate to that inspection module when the inspection module is available or placing the substrate in the buffer unit when that inspection module is unavailable.

2. The coating and developing system control method according to claim 1, further comprising the step of generating an alarm when it is decided in step (a3) that the buffer unit is unavailable.

3. The coating and developing system control method according to claim 1, wherein an uninspected substrate as an inspection subject carried to the second transfer unit is carried to the carrier station.

4. The coating and developing system control method according to claim 3, wherein the substrate as an inspection subject carried to the carrier station is carried into the carrier.

5. The coating and developing system control method according to claim 3, further comprising the step of carrying the uninspected substrate as an inspection subject carried to the carrier station to the inspection station.

6. The coating and developing system control method according to claim 5, further comprising the step of selecting executing the step of carrying the substrate as an inspection subject to the inspection station or not executing the same step.

7. The coating and developing system control method according to claim 1, further comprising the steps of:
   transferring a substrate taken out from the carrier to a third transfer unit by the first substrate carrying means, and
   carrying the substrate across the inspection station from the third transfer unit to the processing station.

8. The coating and developing system control method according to claim 1, wherein the buffer unit is vertically aligned along a common plane with at least one of the first transfer unit or the second transfer unit, and at least one inspection station.

* * * * *